US010437329B2

(12) United States Patent
Konstantatos et al.

(10) Patent No.: US 10,437,329 B2
(45) Date of Patent: Oct. 8, 2019

(54) GAZE TRACKING APPARATUS

(71) Applicant: FUNDACIÓ INSTITUT DE CIÈNCIES FOTÒNIQUES, Castelldefels (ES)

(72) Inventors: Gerasimos Konstantatos, Castelldefels (ES); Frank Koppens, Castelldefels (ES); Stijn Goossens, Castelldefels (ES)

(73) Assignee: Fundació Institut de Ciències Fotòniques, Castelldefels (ES)

( * ) Notice: Subject to any disclaimer, the term of this patent is extended or adjusted under 35 U.S.C. 154(b) by 80 days.

(21) Appl. No.: 15/891,724

(22) Filed: Feb. 8, 2018

(65) Prior Publication Data
US 2018/0217665 A1 Aug. 2, 2018

Related U.S. Application Data

(63) Continuation-in-part of application No. 15/227,327, filed on Aug. 3, 2016, now Pat. No. 9,955,100.

(30) Foreign Application Priority Data

Aug. 3, 2015 (EP) .................................... 15179484

(51) Int. Cl.
*G06F 3/01* (2006.01)
*G01J 1/16* (2006.01)
(Continued)

(52) U.S. Cl.
CPC ............ *G06F 3/013* (2013.01); *G01J 1/0209* (2013.01); *G01J 1/0219* (2013.01); *G01J 1/0488* (2013.01);
(Continued)

(58) Field of Classification Search
None
See application file for complete search history.

(56) References Cited

U.S. PATENT DOCUMENTS 4,496,981 A * 1/1985 Ota .......................... G02F 1/1354
348/294
5,349,174 A 9/1994 Van Berkel et al.
(Continued)

FOREIGN PATENT DOCUMENTS

WO    WO 2013/017605 A1    2/2013

OTHER PUBLICATIONS

Findlater et al., "A CMOS Image Sensor With a Double-Junction Active Pixel," IEEE Transactions on Electron Devices, vol. 50, No. 1, p. 1-12 (Jan. 2003).

(Continued)

*Primary Examiner* — Sinh Tran
*Assistant Examiner* — Quan Pham
(74) *Attorney, Agent, or Firm* — Jenkins, Wilson, Taylor & Hunt, P.A.

(57) ABSTRACT

Provided are gaze tracking apparatuses, which in some embodiments can include an optoelectronic device, wherein the optoelectronic device includes an image sensor with non-local readout circuit having a substrate and a plurality of pixels and operatively connected to a control unit, wherein a first area of the substrate is at least partially transparent to visible light and at least the plurality of pixels of the image sensor are arranged on the first area of the substrate to aim to an eye of a user when placed in front of an inner face of the substrate, and wherein the control unit is also adapted to control the image sensor to acquire image information from the user's eye for performing a gaze tracking of the user's eye.

20 Claims, 22 Drawing Sheets

(51) Int. Cl.

| | |
|---|---|
| *H04N 5/374* | (2011.01) |
| *G06K 9/00* | (2006.01) |
| *G06F 1/16* | (2006.01) |
| *G06F 3/03* | (2006.01) |
| *G01J 1/02* | (2006.01) |
| *G01J 3/28* | (2006.01) |
| *H01L 27/146* | (2006.01) |
| *G01J 1/04* | (2006.01) |
| *G01J 1/42* | (2006.01) |
| *G06K 9/20* | (2006.01) |
| *G01J 3/12* | (2006.01) |

(52) U.S. Cl.
CPC ........... *G01J 1/1626* (2013.01); *G01J 1/4228* (2013.01); *G01J 3/2803* (2013.01); *G06F 1/1601* (2013.01); *G06F 1/163* (2013.01); *G06F 1/1637* (2013.01); *G06F 1/1684* (2013.01); *G06F 3/011* (2013.01); *G06F 3/0304* (2013.01); *G06K 9/00604* (2013.01); *G06K 9/2009* (2013.01); *H01L 27/146* (2013.01); *H01L 27/14665* (2013.01); *H04N 5/374* (2013.01); *G01J 2003/1213* (2013.01); *G01J 2003/282* (2013.01); *G01J 2003/2806* (2013.01)

(56) References Cited

U.S. PATENT DOCUMENTS

| | | | |
|---|---|---|---|
| 5,550,585 A * | 8/1996 | Cherri | G02B 27/017 348/207.99 |
| 5,873,003 A * | 2/1999 | Inoue | G02B 7/287 257/E27.136 |
| 6,300,612 B1 | 10/2001 | Yu | |
| 6,974,971 B2 | 12/2005 | Young | |
| 8,053,782 B2 | 11/2011 | Avouris et al. | |
| 8,193,601 B2 | 6/2012 | Sambandan et al. | |
| 8,803,128 B2 | 8/2014 | Sargent et al. | |
| 2003/0201518 A1 | 10/2003 | Mann et al. | |
| 2006/0243805 A1 * | 11/2006 | Mative | G06F 3/013 235/462.01 |
| 2007/0131992 A1 | 6/2007 | Dosluoglu et al. | |
| 2011/0199518 A1 | 8/2011 | Zheng et al. | |
| 2014/0299741 A1 | 10/2014 | Colli | |
| 2014/0353471 A1 | 12/2014 | Raynor et al. | |
| 2016/0366354 A1 * | 12/2016 | Konstantatos | H01L 27/14612 |
| 2017/0041564 A1 | 2/2017 | Konstantatos et al. | |

OTHER PUBLICATIONS

Notice of Allowance and Examiner-Initiated Interview Summary corresponding to U.S. Appl. No. 15/227,327, dated Dec. 28, 2017.
Office Action (Restriction Requirement) corresponding to U.S. Appl. No. 15/227,327, dated Sep. 28, 2017.

* cited by examiner

Gaze tracking principle, conventional

Improved gaze tracking

Virtual reality

Integration on windows

Overview light paths

Electronics 1

GAZE TRACKING APPARATUS

CROSS REFERENCE TO RELATED APPLICATIONS

This application is a continuation in part of U.S. patent application Ser. No. 15/227,327, filed Aug. 3, 2016, (now pending), which itself claims the benefit of European Patent Application Serial No. 15179484.9, filed Aug. 3, 2015. The disclosure of each of these applications is incorporated herein by reference in its entirety.

FIELD OF THE INVENTION

The present invention relates to the field of image sensors, in particular image sensors comprising a substrate, a plurality of pixels arranged on a first area of the substrate, and a control unit operatively connected to the plurality of pixels and adapted to selectively bias said pixels and read them out. An image sensor according to the present invention achieves an efficient integration of the plurality of pixels together with the control unit while avoiding in-pixel readout electronics, leading to more simple and compact pixels, and making the image sensor well-suited for integration in devices that need to be flexible and/or stretchable and/or transparent (or at least partially transparent) to the human eye. Moreover, the particular pixel design of the image sensors of the present invention makes it possible to obtain pixels with high photoconductive gain, i.e. with a built-in photoconductive gain, enhanced responsivity and/or improved sensitivity. The present invention also relates to an optoelectronic device comprising said image sensor, and to a gaze tracking apparatus comprising said optoelectronic device.

BACKGROUND OF THE INVENTION

The use of image sensors is known in numerous applications ranging from the general-consumer gadgets sector, to the professional photography, to gaze tracking, and to industrial, medical and/or scientific uses, just to cite a few.

A typical image sensor comprises a plurality of pixels operatively connected to a control unit adapted to selectively bias said pixels and read them out. Each pixel includes a photo-active element or photodetector, which is usually a photodiode.

The image sensor market is at present dominated by active pixel sensors (APSs), which are fully-compatible with the CMOS process. A typical pixel in an APS comprises a photodiode for the collection of light, a switching element (such as for example a transistor) to allow the pixel to be individually addressed during readout, and an amplifier.

Current technology trends in the APS design aim at the miniaturization of the pixels while, at the same time, embedding more functionality in the pixels to provide enhanced features, such as for instance global shuttering or noise reduction among others. However, these conflicting trends complicate the design of the pixel and that of the overall image sensor.

As the size of the pixels shrinks, so does the size of their photodiodes. Given that the quantum efficiency of typical photodiodes cannot exceed one for the visible and infrared ranges, APSs critically rely on reaching very low noise levels and/or on using long exposure times, to achieve high signal-to-noise ratios. Moreover, as more and more transistors are required inside the pixel to implement such advanced functionality, the area available for light collection of the photodiode (or pixel fill factor) is further decreased. Therefore, image sensors with an improved pixel design and a more sophisticated readout circuit will be necessary to cope with the increasingly demanding performance specifications.

Back-side illuminated image sensors have been developed in an attempt to overcome the reduction in pixel fill factor of conventional image sensors (also referred to as front-side illuminated image sensors). In a back-side illuminated image sensor, the in-pixel readout electronics is arranged behind the semiconductor layer comprising the photodiode, as opposed to their front-side illuminated counterparts in which said in-pixel readout electronics lays on the same semiconductor layer as the photodiode or above. This is typically done by flipping the semiconductor wafer during manufacturing and then thinning its reverse side so that the incoming light can impinge on the photodiode without passing through the in-pixel readout electronics. Back-side illuminated image sensors achieve a substantial improvement in the pixel fill factor and, hence, in their photon-collecting ability, improvement which is even more significant when the pixel-size is small. However, one important shortcoming of back-side illuminated image sensors is that their manufacturing becomes dramatically more complicated and costly.

After APSs, the second largest portion of the market of image sensors is occupied by charged-coupled devices (CCDs) which, although also using a photodiode for light collection, their manufacturing and operation is quite different from that of APSs. In a CCD the charge generated by the collection of photons at a given pixel, and initially stored in a capacitive storage element in said pixel, is then transferred from within the device to a processing area where it can be converted to an electrical signal. Typically, the transfer of the photo-collected charge of the pixels to the processing area is done in a stepped and synchronized manner in which the charge collected in a pixel of each row (or column) of a two-dimensional arrangement of pixels is progressively shifted by one row (or column) and stored in the capacitive storage element of the pixel in the adjacent row (or column) until eventually reaching the processing area of the CCD.

Compared to APSs, CCDs do not require switching elements or amplifiers to be provided inside the pixel. However, one of the main drawbacks of this type of image sensors is that they need a more complex readout electronics to handle the charge shifting process. Moreover, CCDs require a dedicated manufacturing technology that is costly and, more importantly, incompatible with standard CMOS processing.

Another important aspect to take into account is the spectral range in which an image sensor is to operate as it will greatly determine the choice of the available light-absorbing materials for the fabrication of the photo-active element of the pixels.

In that sense, silicon is widely used in image sensors operating in the visible and near infrared ranges. In contrast, compounds such as InGaAs or HgCdTe, among others, are often employed for the infrared range (including short-wave infrared and/or long-wave infrared subranges). Finally, for image sensors operating in the ultraviolet region, and shorter-wave ranges, some known suitable materials include wide-gap semiconductors, such as for instance AlGaN.

Image sensors that integrate silicon (e.g., CMOS technology) for their control unit with photosensitive materials other than silicon for the photo-active elements of the pixels (also referred to as hybrid image sensors) offer an extended operating spectral range compared to CMOS-based image sensors. However, as for CMOS-based image sensors, hybrid image sensors do not provide a practical solution to the technological challenges of miniaturization and embedding more functionality at the pixel level, with the added disadvantage that such hybrid integration involves difficult and costly bonding processes.

The rapid development in the recent years of a market for consumer gadgets, wearable devices and mobile applications has stirred a growing interest in the development of technology able to provide components, and even full devices, being flexible and/or stretchable and/or transparent (or at least partially transparent) to the human eye.

Given that most of such devices incorporate image sensors, it would be desirable to have an imaging technology able to provide flexible and/or transparent image sensors. However, none of the imaging technologies described above is intended to produce image sensors with such properties.

Some image sensors have been proposed in an attempt to provide a transparent solution. For example, document U.S. Pat. No. 5,349,174 A discloses an image sensor having a two-dimensional arrangement of pixels disposed on a transparent substrate. In addition, the pixels of said image sensor comprise some elements, such as for instance a storing capacitor, that are also transparent. Although the resulting image sensor is semitransparent (as only a portion of the area occupied by the pixels is transparent), it is not intended to be flexible. Moreover, the control unit of the image sensor requires in-pixel switching elements for addressing individual pixels upon readout, which reduces the pixel fill factor and increases the complexity of the pixel design and that of the readout circuit of the control unit.

There have also been some attempts to provide a flexible image sensor. For example, document U.S. Pat. No. 6,974,971 B2 describes an image sensor that is bendable up to a certain extent, and that includes an array of pixels disposed on discrete areas of a substrate. Selected regions of the substrate, away from those areas in which the pixels are formed, are weakened to encourage flexing of the substrate to occur preferentially at those regions upon bending of the device and, in this manner, reduce the risk of damaging the pixels. Another example is disclosed in U.S. Pat. No. 8,193,601 B2, in which an image sensor comprises a plurality of pixels, each having a PIN photodiode as photo-active element, disposed on a flexible substrate. However, these solutions are far from satisfactory as in-pixel selection elements, in particular thin-film transistors (TFTs), are still required to selectively read out the pixels.

Photo-active elements based on organic photodiodes, as the ones described in U.S. Pat. No. 6,300,612 B1, have also been thought of as promising candidates for flexible and transparent image sensors. However, these image sensors will generally still need an in-pixel switching element for addressing individual pixels. Moreover, organic photodiodes have a fairly limited responsivity, well below 1 A/W, which might be problematic when used in image sensors, especially in those featuring small-sized pixels.

The use of active devices based on two-dimensional (2D) materials, such as for instance graphene, for different applications is the object of on-going research. For example, single-pixel photodetectors having a photosensitive element made of graphene have been demonstrated as proof of concept. The use of photodetectors based on 2D materials (e.g., graphene, as disclosed in for instance U.S. Pat. No. 8,053,782 B2) or on semiconductor nanocrystals (e.g. quantum dots, see for example U.S. Pat. No. 8,803,128 B2) in the pixels of full-size image sensors has also been proposed. However, such image sensors typically exhibit limited photoconductive gain.

Therefore, it would be highly desirable to have image sensors in which the photosensitive element of their pixels is capable of providing a high photoconductive gain, without compromising the pixel sensitivity due to, for example, high dark current levels.

Document US2014353471A1 describes a dark current suppression scheme based on a photosensitive and a shielded photodiode and which includes only one biasing circuit (providing bias voltage VRT, as shown in its FIG. 1). The scheme proposed in said document provides dark current compensation based on temperature information and temperature dependent calibration information.

Document WO 2013/017605 A1 discloses a phototransistor comprising a transport layer made of graphene, and a sensitizing layer disposed above the transport layer and that is made of colloidal quantum dots. The sensitizing layer absorbs incident light and induces changes in the conductivity of the transport layer to which it is associated. The high carrier mobility of graphene and the long carrier lifetime in the quantum dots make it possible for the phototransistor disclosed therein to obtain a large photoconductive gain. However, the device can only achieve desired responsivity levels at the expense of increased dark current levels, which in turn degrade the sensitivity and the shot-noise limit of the device.

Document US 2014/0299741 A1 refers to a transparent ambient-light sensor using sensitized graphene photodetectors that comprise two types of quantum dots arranged on a sheet of graphene. By detecting the difference in response of the two types of quantum dots, the sensor can provide ambient light and bandwidth sensing. Although this solution works for a reduced number photodetectors, it is not scalable to imaging applications involving a large number of pixels (typically a few millions), each pixel comprising a photodetector, as the power consumption of the device to bias simultaneously all the pixels would be prohibitive for any practical image sensor. Moreover, the architecture of the ambient-light sensor is very different from that of an image sensor, the latter requiring a control unit to selectively read out the pixels.

Paper 'A CMOS image sensor with a double junction active pixel', IEEE Transactions on Electron Devices, Vol. 50, no. 1, pp 32-42, by Findlater K. M. a t al., discloses a CMOS image sensor that employs a vertically integrated double-junction photodiode structure. Some elements of the read-out circuit of the image sensor disclosed in said paper are local, i.e. are arranged at the pixel level. Specifically, for the arrangement shown in its FIG. 7, the pixels contain six active transistors to which reset and read signal lines are connected, and which therefore constitute local elements of the read-out circuit. The photodiodes forming the image sensor disclosed in said paper cannot be considered as photosensitizing elements, and the arrangement forming the image sensor does not either comprise a transport layer for transporting electric charge carriers.

It is therefore an object of the present invention to provide an enhanced image sensor in which the integration of its pixels with the control unit can be done in a simple and efficient manner, while avoiding a reduction in the pixel fill factor due to in-pixel read-out electronics.

It is also an object of the present invention to provide an image sensor in which its pixels comprise an improved photo-active element capable of high photoconductive gain, i.e. a built-in photoconductive gain, and/or enhanced responsivity.

It is a further object of the present invention to provide an image sensor with an improved sensitivity of its pixels, and that does not require deep cooling of the device to achieve high signal-to-noise ratios.

It is yet another object of the present invention to provide an image sensor well-suited for flexible and/or stretchable and/or transparent optoelectronic devices.

It is yet another object of the present invention to provide a gaze tracking apparatus based on the image sensor of the invention.

SUMMARY OF THE INVENTION

The objects of the present invention are solved with the image sensor with non-local readout circuit, the optoelectronic device, and the gaze tracking apparatus of the present invention. Other favorable embodiments of the invention are defined in the dependent claims.

In the scope of the present invention the term image sensor refers to a photodetector array of m×n pixels, where m and n can be any number starting at 1.

An aspect of the present invention relates to an image sensor with non-local readout circuit comprising a substrate, a plurality of pixels arranged on a first area of the substrate, and a control unit operatively connected to the plurality of pixels and adapted to selectively bias said pixels and read them out. The image sensor is characterized in that the control unit comprises a first biasing circuit for providing a first biasing voltage, a second biasing circuit for providing a second biasing voltage, the second biasing voltage being substantially symmetrical to the first biasing voltage with respect to a voltage reference, and a readout circuit for reading out the photo-signal generated by the light impinging on the pixels.

The first biasing circuit and the second biasing circuit comprise, respectively, first selection means and second selection means to selectively bias one or more pixels of said plurality that are to be read out at a given time, the first selection means and the second selection means being arranged outside the first area of the substrate.

In accordance with the present invention, the image sensor is further characterized in that each pixel of the plurality of pixels comprises: a photo-active element comprising a photosensitizing layer associated to a transport layer, the transport layer including at least one layer of a two-dimensional material; a non photo-active reference element disposed proximate to the photo-active active element, the reference element having a dark conductance that substantially matches the dark conductance of the photo-active element; a first contact circuitally connected to the first biasing circuit; a second contact circuitally connected to the second biasing circuit; and an output contact circuitally connected to the readout circuit.

Moreover, the photo-active element is circuitally connected between the first contact and the output contact, and the reference element is circuitally connected between the output contact and the second contact.

The readout circuit is called non-local readout circuit because is arranged outside the first area of the substrate, and preferably all of the pixels of the above mentioned plurality of pixels are absent of embedded readout electronics.

For a preferred embodiment, the first biasing circuit and the second biasing circuit are independent biasing circuits having their own independent control electronics providing the first biasing voltage and the second biasing voltage, respectively.

The combination of a photo-active element with a non photo-active reference element in the pixels of the image sensor makes it possible to obtain the full benefit of the high photoconductive gain and enhanced responsivity of sensitized two-dimensional-material-based photodetectors without suffering the drawbacks of increased dark current levels, and its subsequent loss in pixel sensitivity.

The non photo-active (or blind) reference element, together with the particular interconnection of the photo-active element and the reference element, and their biasing with substantially symmetrical biasing voltages, enable a balanced readout scheme of the photo-signal generated in the photo-active element of the pixels that makes it possible to substantially suppress the dark current generated in the photo-active element of the pixel due to the biasing voltages during the exposure cycle.

In this way it is no longer needed to give up in terms of electrical performance of the photo-active elements (e.g. in terms of responsivity) in order to keep the dark current levels low. In consequence, regardless the biasing voltages applied, the image sensor of the present invention makes it possible to obtain enhanced pixel sensitivity and high signal-to-noise ratios, even without cooling the device.

The non photo-active (or blind) reference element arranged in each pixel has a dark conductance that substantially matches the dark conductance of the photo-active element of the pixel to which said reference element is associated. In this manner, the reference element simulates the behavior of the photo-active element of said pixel during the exposure cycle.

In accordance with the present invention, the dark conductance of a reference element of a pixel substantially matches the dark conductance of the photo-active element of said pixel if the dark conductance of the former does not differ from the dark conductance of the latter by more than 25%, 20%, 15%, 15%, 10%, 8%, 5%, 3% or even 1%.

In some embodiments, the reference element of each pixel is individually fine-tuned so that its dark conductance closely matches the dark conductance of its associated photo-active element.

Moreover, because of the arrangement of the photo-active element between the first contact and the output contact and the reference element between the output contact and the second contact, when substantially symmetrical biasing voltages are applied to the first and second contacts of a given pixel, the voltage difference at the output contact of said pixel contains directly the photo-signal generated in said pixel by the incident light.

In case that the dark conductance of a reference element of a pixel exactly matched the dark conductance of the photo-active element of said pixel, then the dark current generated in the photo-active element of said pixel during the exposure cycle would be best suppressed by setting the second biasing voltage to be exactly symmetrical to the first biasing voltages. However, in practical situations, a substantial match between the dark conductance of the reference element of a pixel and that of its associated photo-active element will be more likely than a perfect match. For that reason, it may be advantageous to set the first and second biasing voltages to slightly different values, while still being substantially symmetrical, in order to minimize the dark current generated in the pixel. In other words, a slight amplitude "detune" between the first and second biasing voltages may efficiently compensate for a residual mismatch between the dark conductance of the reference and photo-active element of a pixel.

The photoconductive gain obtained from the photo-active element of the pixels advantageously eliminates the need for the pre-amplification of the photo-signal generated by the incident light inside the pixel, conversely to the pixels of APSs in which such pre-amplification is required.

In addition, the first and second selection means allow to selectively bias the pixels of the image sensor enabling only the pixel or pixels that are to be read out at a given time, while leaving the other pixels disabled. In this way, the image sensor of the present invention does not require in-pixel selection elements for the readout process.

Given that the photo-active and reference elements can be directly connected between the first and second biasing contacts and the output contact without requiring any additional in-pixel electronics (such as amplifiers or selection elements), the pixel design is greatly simplified, maximizing the area available for the collection of light. In this manner, it is possible to obtain smaller-sized pixels without compromising the pixel fill factor, which can still be very high.

The high photoconductive gain of the photo-active element of the pixels combined with the balanced biasing scheme of the pixels makes it possible to transfer the readout electronics from inside the pixels to outside the first area of the substrate occupied by the plurality of pixels. The readout electronics can now be advantageously arranged on peripheral portions of said substrate or even on a different substrate, hence obtaining an image sensor with a non-local readout circuit.

In the context of the present invention, the term non-local readout circuit preferably refers to the fact that there is no readout electronics embedded in the pixels of the image sensor, in contraposition to the image sensors of the prior art, in which there is in-pixel readout electronics.

Finally, as no opaque and/or bulky electronics are required in the area of the substrate occupied by the plurality of pixels, the resulting image sensor is well-suited for integration into devices that need to be flexible and/or stretchable and/or transparent (or at least partially transparent) to the human eye.

According to the present invention, a device is considered to be transparent if at least the 80% of the incident light in the visible part of the spectrum is transmitted through said device. Similarly, a device is considered to be partially transparent if at least 30% of the incident light in the visible part of the spectrum is transmitted through said device. Alternatively, a device is considered to be opaque if less than 3% of the incident light in the visible part of the spectrum is transmitted through said device.

Also in accordance with present invention, a device being flexible preferably refers to a device that can be deformed, twisted, bent, rolled and/or folded (hence changing its shape or form) without being damaged or having its performance degraded.

Also in accordance with present invention, a device being stretchable preferably refers to a device that can be deformed, strained, elongated and/or widened (hence changing its shape or form) without being damaged or having its performance degraded.

In the context of the present invention the term two-dimensional material preferably refers to a material that comprises a plurality of atoms or molecules arranged as a two-dimensional sheet with a thickness substantially equal to the thickness of the atoms or molecules that constitute it.

In some embodiments, the transport layer of the photo-active element of one or more pixels includes at least five, ten, twenty, forty or even fifty layers of a two-dimensional material.

Also in the context of the present invention a photosensitizing layer being associated to a transport layer preferably refers to the fact that light absorption in the photosensitizing layer results in a change in charge carrier density inside the transport layer, which, for an embodiment, comprises graphene.

This can for example be due to the following processes:

An electron (or a hole) from an electron-hole pair generated in the photosensitizing layer by the absorption of a photon can be transferred to the transport layer while the hole (or the electron) of said electron-hole pair remains trapped in the photosensitizing layer, or an interface between the photosensitizing layer and the transport layer, such as for instance in a dielectric layer disposed there between. In some embodiments, the photosensitizing layer is disposed above, such as for example directly above, the transport layer. Alternatively, in some other embodiments the photosensitizing layer is disposed below, such as for example directly below, the transport layer, so that a photon must cross the transport layer before reaching the photosensitizing layer where it will be absorbed.

Alternatively, light absorption in the photosensitive layer leads to bound charges in the proximity of the surface of the photosensitive layer. This draws charges into the graphene and/or into any other material forming the transport layer, which changes its electrical conductivity.

In this sense, the heterojunction formed by the photosensitizing layer and the transport layer slows down recombination and makes it possible to collect several electric carriers for a single absorbed photon, which compounded with the high carrier mobility of the two-dimensional material comprised in the transport layer, results in the photo-active element of the pixels featuring very high photoconductive gain and responsivity.

In addition, the spectral sensitivity of the photo-active element of the pixels can be advantageously tailored by appropriately selecting the material of the photosensitizing layer. In this manner, the spectral range for photodetection of the photo-active element can be extended over a large bandwidth.

In some embodiments, the photosensitizing layer of the photo-active element of one or more pixels comprises a photo-absorbing semiconductor, a 2D material, a polymer, a dye, quantum dots (such as for instance colloidal quantum dots), a ferroelectric material, Perovskite and/or a combination thereof.

The photosensitizing layer may for example comprise nanocomposite films containing blends of the aforementioned materials. It may also be a single-layered structure or, alternatively, a multi-layered structure, in which one or more of the aforementioned materials constitute different layers stacked on each other, each having thicknesses preferably between approximately 5 nm and approximately 400 nm.

In those embodiments in which the photosensitizing layer comprises quantum dots, these are preferably of one or more of the following types: $Ag_2S$, $Bi_2S_3$, CdS, CdSe, CdHgTe, $Cu_2S$, CIS (copper indium disulfide), CIGS (copper indium gallium selenide), CZTS (copper zinc tin sulfide), Ge, HgTe, InAs, InSb, ITO (indium tin oxide), PbS, PbSe, Si, $SnO_2$, ZnO, and ZnS.

Similarly, in some embodiments the at least one layer of a two-dimensional material comprised in the transport layer of the photo-active element of one or more pixels comprises one or more of the following materials: graphene, $MoS_2$, $MoSe_2$, $WS_2$, $WSe_2$, black phosphorus, $SnS_2$, and h-BN (hexagonal boron nitride).

In the context of the present invention, two voltages are considered to be substantially symmetrical (in particular substantially symmetrical with respect to a voltage reference) if they have opposite signs with respect said voltage reference and the magnitude of one differs from the magnitude of the other in less than a 25%, 20%, 15%, 10%, 8%, 5%, 3% or even 1%.

Also in the context of the present invention, a layer (or an element, or a contact, or a device) of the image sensor is considered to be above another, if the former is farther from the substrate of the image sensor than the latter, along a direction perpendicular to said substrate.

Similarly, a layer (or an element, or a contact, or a device) of the image sensor is considered to be below another, if the former is closer to the substrate of the image sensor than the latter, along said perpendicular direction.

Also in accordance with the present invention, the term above (or below) is not to be construed as implying than one layer (or an element, or a contact, or a device) is immediately or directly above (or below) another unless explicitly stated otherwise. In that sense, a layer being disposed above (or below) another does not preclude the possibility of additional layers being arranged in between those two.

In the same manner, in the context of the present invention the term circuitally connected preferably refers to the fact that a first entity (e.g., a contact, an element or a circuit) may be connected to a second entity by means of a circuit, which may comprise one or more conductive traces and/or one or more circuit components operatively arranged between said two entities. Thus, the term circuitally connected is not to be construed as requiring a direct ohmic connection of the first entity to the second entity (i.e., without any intervening circuit components) unless explicitly stated.

In some embodiments, the first selection means and/or the second selection means advantageously comprise a plurality of switches or a multiplexer.

In some embodiments the first contact and the output contact of at a given pixel are disposed above the transport layer of the photo-active element of said pixel, whereas in other embodiments said first contact and output contact are disposed below the transport layer of said photo-active element. In yet other examples, one of said two contacts is disposed above the transport layer of the photo-active element of the pixel while the other is disposed below the transport layer of the photo-active element.

In certain cases, the first, second and/or output contact of one or more pixels of the plurality of pixels are made of a transparent conducting oxide, such as indium tin oxide (ITO).

In some examples the control unit is disposed on a second area of the substrate, said second area not overlapping said first area on which the plurality of pixels are arranged. However, in other examples, the control unit is disposed on another substrate provided in the image sensor.

In a first group of embodiments, the reference element of at least one pixel of the plurality of pixels comprises a transport layer, said transport layer including at least one layer of a two-dimensional material. Preferably, said reference element further comprises a photosensitizing layer associated to the transport layer of the reference element.

As the structure of the reference element mimics that of the photo-active element of the pixel, it is possible to obtain in a simple manner a reference element with a dark conductance that accurately matches the dark conductance of the photo-active element.

In these embodiments, the second contact and the output contact of at a given pixel may be disposed both above, both below, or one above and the other below the transport layer of the reference element of said pixel.

In some examples in which the reference element of said at least one pixel comprises a transport layer and a photosensitizing layer associated thereto, said reference element further comprise a first light-blocking layer disposed above the photosensitizing layer and the transport layer of said reference element.

The first light-blocking layer advantageously covers the photosensitizing layer and the transport layer of said reference element, ensuring that no photo-signal is generated in the reference element by the light impinging on the image sensor. Otherwise, the conductance of said reference element would be undesirably modified and, hence, its ability to subtract the dark current component from the photo-signal generated at the photo-active element of the pixel would be degraded.

More preferably, the reference element of said at least one pixel also comprises a second light-blocking layer disposed below the photosensitizing layer and the transport layer of said reference element.

The second light-blocking layer protects the photosensitizing layer and the transport layer of said reference element from light that could arrive through the substrate of the image sensor, as it could happen in those cases in which the image sensor comprises a thin and/or transparent substrate.

In the context of the present invention the term light-blocking layer preferably refers to the fact that said layer is opaque for the range of wavelengths of operation of the photo-active element of the plurality of pixels. However, said layer may at the same time be transparent, or at least partially transparent, to the human eye.

Alternatively, the image sensor may comprise a substrate that is opaque for the range of wavelengths of operation of the photo-active element of the plurality of pixels. Such feature advantageously eliminates the need for a second light-blocking layer in the reference element of said at least one pixel.

In an embodiment, the first and/or second light-blocking layers take the form of a passivation layer, said passivation layer preferably comprising an oxide.

Alternatively, in other instances of such cases, the photosensitizing layer of the reference element of said at least one pixel is not sensitive in the range of wavelengths of operation of the photo-active element of the said pixel.

This results in a simpler reference element design because it eliminates the need for light-blocking layers, as the light impinging on said reference element cannot be absorbed by its photosensitive layer.

In the context of the present invention, a photosensitizing layer of the reference element of a pixel is considered not to be sensitive in the range of wavelengths of operation of the photo-active element of said pixel if the spectral absorbance of the photosensitizing layer of said reference element at any given wavelength within that range is smaller than a 25% of the lowest spectral absorbance of the photo-active element for the range of wavelengths of operation.

In some embodiments of this first group, the transport layer of the reference element of said at least one pixel has a smaller area than the transport layer of the photo-active element. In this way, the overhead in real estate due to the presence of the reference element in the pixel is minimized.

In order to avoid altering the dark conductance of the reference element, which must substantially match the dark conductance of the photo-active element contained in the same pixel, the transport layer of the reference element may preferably have the same shape (or geometry or form factor) as the transport layer of the photo-active element.

Alternatively, in case that the transport layer of the reference element and that of the photo-active element of a pixel have different shapes, then the doping of the transport layer of the reference element can be advantageously varied with respect to the doping of the transport layer of the photo-active element so that the dark conductance of the former substantially matches the dark conductance of the latter.

In some cases, the transversal dimensions of the reference element of one or more pixels of the plurality of pixels are below the diffraction limit for the range of wavelengths of operation of the photo-active element of said pixels. In this way, the reference element of said pixels does not block any light incident on the image sensor.

Optionally, the reference element of at least one pixel of the plurality of pixels is arranged between the substrate and the photo-active element of said pixel. Such an arrangement advantageously exploits the third dimension of the structure to obtain a more compact architecture. Moreover, by disposing the reference element below the photo-active element, light absorption by the transport layer and/or the photosensitizing layer of the reference element is further prevented.

However, in other embodiments the reference element of a pixel is disposed on a same level as the photo-active element of said pixel.

In some examples, the image sensor further comprises one or more primary insulating layers associated to the photo-active element of the plurality of pixels. In these examples, at least one pixel of the plurality of pixels preferably comprises:
- a back-gate contact disposed between the substrate and the photo-active element of said at least one pixel, between a primary insulating layer and the substrate, wherein said primary insulating layer is disposed between said photo-active element and the substrate; and/or
- a top-gate contact disposed above the photo-active element of said at least one pixel.

By providing a back-gate contact and/or a top-gate contact, the photo-active element of the pixels can be gated to finely control the conduction and photosensitivity of the photosensitizing layer.

Preferably, the top-gate contact and/or the back-gate contact is made of a transparent material, so as to not hinder the light absorption capabilities of the photo-active element of the pixels.

In those cases in which a pixel comprises a top-gate contact disposed above its photo-active element, the image sensor preferably comprises a (or a further) primary insulating layer disposed between said top-gate contact and the photo-active element of said pixel.

In some embodiments of said first group, the image sensor may also comprise one or more secondary insulating layers associated to the reference element of the plurality of pixels. Then, in such embodiments at least one pixel of the plurality of pixels preferably comprises:
- a back-gate contact disposed between the substrate and the reference element of said at least one pixel, between a secondary insulating layer and the substrate, wherein said secondary insulating layer is disposed between said reference element and the substrate; and/or
- a top-gate contact disposed above the reference element of said at least one pixel.

By providing a back-gate contact and/or a top-gate contact, the reference element of the pixels can be gated to finely control its conductance.

Moreover, in those cases in which a pixel comprises a top-gate contact disposed above its reference element, the image sensor preferably comprises a (or a further) secondary insulating layer disposed between said top-gate contact and the reference element of said pixel.

In accordance with the present invention, a primary insulating layer associated to a photo-active element preferably refers to the fact that said insulating layer is disposed above (such as for instance directly above) or alternatively below (such as for instance directly below) both the transport layer and the photosensitizing layer of said photo-active element.

Similarly, also in accordance with the present invention, a secondary insulating layer associated to a reference element preferably refers to the fact that said insulating layer is disposed above (such as for instance directly above) or alternatively below (such as for instance directly below) said reference element. In that sense, if a reference element comprises a transport layer and a photosensitizing layer, then the secondary insulating layer would be above or below both layers of said reference element.

Preferably, said one or more primary and/or secondary insulating layers comprise an oxide.

In some cases, the image sensor further comprises an encapsulation layer disposed above the plurality of pixels. In this manner, the photo-active elements and the reference elements of the pixels are advantageously protected. Preferably, the encapsulation layer comprises a dielectric material having a wide bandgap, to minimize the absorption of light at the wavelengths of operation of the photo-active elements.

In some embodiments of the image sensor of the present invention, the plurality of pixels are grouped into clusters, each cluster comprising one or more pixels, with the photosensitizing layer of the photo-active element of the one or more pixels of each cluster being sensitive to a different range of the spectrum.

This makes it possible to obtain an image sensor with an extended frequency range of operation, covering from X-ray photons and the ultraviolet (UV) to the infrared (IR), including near-infrared (NIR), short-wave infrared (SWIR), mid-wave infrared (MWIR) and long-wave infrared (LWIR), and even THz frequencies. It also allows implementing image sensors having multicolor pixels by, for example, tailoring the properties of the material selected for the photosensitizing layer.

The image sensor and the optoelectronic system of the present invention can also be applied to spectrometry, thus constituting a spectrometer.

In a preferred embodiment of the image sensor of the present invention, the plurality of pixels are arranged as a two-dimensional array comprising a plurality of rows, each row comprising the same number of pixels. In said embodiments, the first selection means and the second selection means comprise, respectively, first row-select switches and second row-select switches to selectively bias the rows of the array.

The first and second row-select switches make it possible to enable only one row (or a few rows) of the array while leaving the other rows disabled. In this manner, the power consumption of the image sensor during operation is advantageously reduced.

Preferably, the control unit is operatively connected to the first row-select switches and the second row-select switches, and is conFigured to sequentially read out the rows of pixels by activating the first row-select switch and the second row-select switch of one row at a time.

By biasing the rows sequentially, the connection of the pixels of the array to the readout circuit is greatly simplified, as pixels located in different rows (e.g. the pixels forming a column in the two-dimensional array) can be, for instance, daisy-chained to the readout circuit. In such configuration, at any time during the readout process, the pixels in the non-selected rows remain disabled without loading the electrical path that connects a given pixel of the selected row with the readout circuit.

In some examples of said preferred embodiment, the readout circuit comprises:
  a multiplexer comprising as many input terminals as there are pixels in each row and an output terminal, each input terminal of the multiplexer being circuitally connected to the output contact of a pixel of each row; and
  an amplifier operatively connected in series to the output terminal of the multiplexer.

In addition, in said examples the readout circuit optionally comprises a storage element conFigured to store a voltage proportional to the photo-signal generated in a pixel of the plurality of pixels, the storage element being operatively connected in series to the amplifier.

Given that most of the readout electronics is shared by all the pixels of the two-dimensional array, in these examples the overhead in real estate due to the readout circuit is minimized.

Alternatively, in some other examples of said preferred embodiment, the readout circuit comprises:
  as many amplifiers as there are pixels in each row, each amplifier having an input terminal, circuitally connected to the output contact of a pixel of each row, and an output terminal; and preferably
  a storage element connected in series to the output terminal of each amplifier, each storage element being conFigured to store a voltage proportional to the photo-signal generated in a pixel of the plurality of pixels.

Such a case constitutes a good design trade-off, as the additional real estate requirements to accommodate a different amplifier for the pixels forming each column of the array is counterbalanced with a faster pixel readout and more robustness to noise, without increasing the complexity of the pixel design.

In some further examples of said preferred embodiment the readout circuit comprises:
  for each column of a first group of columns of the two-dimensional array, a single amplifier circuitally connected to the output contact of the pixels of said column; and
  for the columns of a second group of columns of the two-dimensional array, an amplifier circuitally connected to the output contact of the pixels of the columns of said second group.

This option advantageously provides greater flexibility to tailor the processing of the photo-signals generated in different areas of the image sensor.

Yet in some other examples of said preferred embodiment, at least one pixel of the plurality of pixels comprises an amplifier embedded inside the pixel. Preferably, said at least one pixel also comprises a storage element connected in series to an output terminal of said amplifier.

In-pixel amplification makes the pixel more robust to noise and allows faster pixel readout, improving the scalability of the pixel array of the image sensor, which may be preferred for those applications of the image sensor in which high bandwidth and throughput is required.

The control unit preferably includes an interconnection circuit (such as for example, but not limited to, a multiplexer) operatively connected to the readout circuit and that comprises one or more output nodes. The interconnection circuit allows circuitally connecting, through the readout circuit, the output contact of any of the pixels of the array with at least one of the one or more output nodes.

In some embodiments, the control unit comprises a post-amplification stage operatively connected to at least one output node of the one or more output nodes of the interconnection circuit.

Optionally, the control unit further comprises a correlation double sampling stage operatively connected between said at least one output node of the interconnection circuit and the post-amplification stage. The correlation double sampling stage advantageously removes any undesired offset in the values detected from the photo-signals read out from the pixels and reduces readout noise components.

Also optionally, the control unit further comprises an analog-to-digital converter operatively connected after the post-amplification stage. In this way, the image sensor outputs can be directly interfaced with digital circuitry, such as for example a field-programmable gate array (FPGA), a digital signal processor (DSP), a microprocessor or a microcontroller.

In certain embodiments of the image sensor of the present invention, the substrate is of a flexible and/or stretchable and, preferably, transparent material. The substrate may be made of polyethylene terephthalate (PET) or polyethylene naphthalate (PEN) among other possible materials.

In this way, the mechanical and/or optical properties of the substrate nicely match those of the materials used in the photosensitizing layer and/or the transport layer of the photo-active elements or the reference elements of the pixels, making it possible to obtain a truly flexible and/or stretchable and/or transparent image sensor.

Optionally in said embodiments, the image sensor further comprises conductive traces that connect the first biasing circuit, the second biasing circuit and the readout circuit with, respectively, the first, second and output contacts of the pixels of the plurality of pixels. In addition, said conductive traces are made of a flexible and/or stretchable and/or transparent conductive material.

Said conductive traces run across said first area of the substrate and from/to the control unit located on peripheral portions of the substrate, outside said first area, and connect the first and second contacts of the pixels with, respectively, the first and second biasing circuits and the output contact of the pixels with the readout circuit.

In some examples, at least some of said conductive traces are made of a transparent conducting oxide, such as indium tin oxide (ITO), although in other examples they can be made of other metallic (and generally conductive) materials as long as they have flexible and/or stretchable and/or transparent properties.

Additionally, when said conductive traces are made of a flexible and/or stretchable material that is not transparent, said conductive traces can be thinned sufficiently so as to have a width below the diffraction limit for the range of wavelengths of operation of the photo-active element of said pixels.

Another aspect of the present invention relates to an optoelectronic device that comprises an image sensor according to the present invention.

In some embodiments, the optoelectronic device is a wearable device, such as for example but not limited to a wristwatch, a device adapted to be attached to the body, a piece of clothing (e.g., textile), a bracelet, eyeglasses or goggles. A flexible and/or stretchable image sensor according to the present invention can be advantageously affixed to, or embedded in, a wearable device.

In some alternative or complementary embodiments, the optoelectronic device comprises a transparent panel, such as a windshield, a window, or a screen of a portable device (e.g., a smartphone or a tablet), on which the image sensor is disposed. Preferably, said transparent panel is made of glass, plastic, or a flexible and/or stretchable material.

The transparency and flexibility properties than can be obtained with the image sensors according to the present invention make these image sensors well suited for consumer gadgets in general, portable devices and/or mobile applications among others. However, these image sensors can also be advantageously integrated into medical devices or devices for automotive applications, among others.

A method for manufacturing an image sensor with a non-local readout circuit such as described above, in which the image sensor comprises a plurality of pixels operatively connected to a control unit adapted to selectively bias said pixels and read them out, comprises the steps of:

a) providing a transport layer including at least one layer of a two-dimensional material, and a photosensitizing layer associated to the transport layer, on a first area of a substrate;

b) providing a first biasing circuit, a second biasing circuit and a readout circuit in the control unit, the first biasing circuit providing a first biasing voltage, the second biasing circuit providing a second biasing voltage substantially symmetrical to the first biasing voltage, and the readout circuit being adapted to read out the photo-signal generated by the light impinging on the pixels;

c) arranging first selection means and second selection means provided, respectively, in the first biasing circuit and the second biasing circuit outside the first area of the substrate, the first selection means and second selection means being adapted to selectively bias one or more pixels of said plurality that are to be read out at a given time;

wherein, for each pixel of the plurality of pixels, the method further comprises:

d) defining a photo-active element at a selected location of the transport layer and the photosensitizing layer arranged on the first area of the substrate, and circuitally connecting the photo-active element between a first contact and an output contact provided in said pixel;

e) arranging a non photo-active reference element proximate to the photo-active active element of said pixel, the reference element having a dark conductance that substantially matches the dark conductance of the photo-active element, and circuitally connecting the reference element between said output contact and a second contact provided in said pixel;

f) circuitally connecting the first contact, the second contact, and the output contact of said pixel to, respectively, the first biasing circuit, the second biasing circuit, and the readout circuit of the control unit.

The present invention further relates to a gaze tracking apparatus, comprising an optoelectronic device, wherein the optoelectronic device comprises:

a substrate having a first area that is at least partially transparent to visible light, a plurality of photodetectors arranged on said first area of the substrate to aim to an eye of a user when placed in front of an inner face of said substrate, and a control unit operatively connected to the plurality of photodetectors to at least receive output signals supplied from each of the photodetectors when light impinges thereon, wherein the control unit is also adapted to perform a gaze tracking of said eye based on the output signals from the photodetectors;

wherein the optoelectronic device comprises an image sensor with non-local readout circuit, wherein said image sensor comprises said substrate and a plurality of pixels arranged on the first area of the substrate, said plurality of pixels comprising said plurality of photodetectors, the plurality of photodetectors comprising photo-active elements and having a built-in photoconductive gain; and wherein—the control unit is adapted to selectively bias said plurality of pixels and read them out by means of a non-local readout circuit comprised by the control unit, said non-local readout circuit being arranged outside the first area of the substrate, and wherein the control unit is also adapted to control the image sensor to acquire image information from said eye for performing said gaze tracking of said eye.

For a preferred embodiment, the control unit comprises:

a first biasing circuit for providing a first biasing voltage;

a second biasing circuit for providing a second biasing voltage, the second biasing voltage being substantially symmetrical to the first biasing voltage with respect to a voltage reference; and the above mentioned non-local readout circuit for reading out a photo-signal generated by light impinging on the plurality of pixels;

wherein the first biasing circuit and the second biasing circuit comprise, respectively, first selection means and second selection means to selectively bias one or more pixels of said plurality of pixels that are to be read out at a given time, the first selection means and the second selection means being arranged outside the first area of the substrate;

and wherein each pixel of the plurality of pixels comprises:

a photo-active element comprising a photosensitizing layer associated to a transport layer, the transport layer including at least one layer of a two-dimensional material;

a non-photo-active reference element disposed proximate to the photo-active active element, the non-photo-active reference element having a dark conductance that substantially matches a dark conductance of the photo-active element;

a first contact circuitally connected to the first biasing circuit;

a second contact circuitally connected to the second biasing circuit; and an output contact circuitally connected to the non-local readout circuit;

wherein the photo-active element is circuitally connected between the first contact and the output contact, and the non-photoactive reference element is circuitally connected between the output contact and the second contact.

For an embodiment, the control unit comprises a processing unit and associated electric and electronic circuitry, including readout electronics, and that is operatively connected to or includes said non-local readout circuit, for receiving and processing said acquired image information to perform said gaze-tracking of said eye.

For an implementation of said embodiment, at least part of said control unit, including said readout electronics, is arranged on an area of the substrate that is outside the first area of the substrate and/or on an area of another substrate.

According to a variant of said implementation, said area of the substrate or of said another substrate where said at least part of the control unit is arranged, is an area that is non-transparent to visible light.

According to an embodiment, the optoelectronic device is a wearable device, wherein the above mentioned substrate is, or comprises, or is attached to, or embedded in, an eyeglass, lens or visor of said wearable device that stands in front of a user's eye when the user wears the wearable device, and wherein said at least part of the control unit is arranged out of said eyeglass, lens, or visor.

For a preferred implementation of said embodiment, the wearable device is one of an eyeglasses and a goggles, comprising one or more of said eyeglass or lens. The terms eyeglasses/goggles includes any type of eyeglasses/goggles or similar devices, including eyeglasses for visual correction and adaptation, such as sun-glasses, and eyeglasses/goggles with other purposes, such as for virtual reality applications, for gaming applications, or for implementing eye control applications, where the eye movement controls the operation of a computer or of another kind of machine.

Said at least part of the control unit arranged out of the eyeglass or lens is arranged, for a variant of said preferred implementation, in a frame of the eyeglasses.

For another embodiment, the wearable device is a helmet comprising the above mentioned visor. That helmet can be a protection helmet, such as a vehicle helmet where the user controls by moving his/her eyes a computer system while driving a vehicle, such as a motor cycle, or flying an airplane, or a virtual reality helmet.

For yet another embodiment, the above mentioned substrate is, or comprises, or is attached to, or embedded in, a panel that is at least partially transparent to visible light, said panel being, for example, a window or a screen.

For an implementation of said embodiment, the gaze tracking apparatus of the present invention further comprises a computing device (smartphone, laptop, computer tablet, smart TV, car computer, etc.) that includes said screen, such as a touchscreen thereof.

Preferably, the optoelectronic device is made and arranged to position, in use, the first area of the substrate in front of the eye of a user when placed in front of said inner face of the substrate, so that the user can see through the first area of the substrate.

That positioning is achieved by the specific construction of the optoelectronic device, such as by the eyeglasses or helmet, which position the first area in front of the user's eye just by including the first area in a predetermined area of an eyeglass, lens or visor thereof, For an embodiment, the gaze tracking apparatus of the present invention is made and arranged to operate under passive illumination, wherein the image sensor is made and arranged to acquire the above mentioned image information from a portion of ambient light that is reflected off of the user's eye.

Alternatively, the gaze tracking apparatus of the present invention further comprises an active illumination unit comprising at least one light source (with low power consumption due to high sensitivity of the photodetectors of the image sensor) that is operatively connected to the control unit, and made and arranged to emit light, in use, towards the user's eye under the control of the control unit, and wherein the image sensor is made and arranged to acquire said image information from light that is emitted from the at least one light source and is reflected off of the user's eye. The illumination unit can emit modulated light that the control unit demodulates when received after being reflected off of the user's eye.

Preferably, the at least one light source and the image sensor operate in an eye-safe short-wave infrared (SWIR) range, preferably between 1300-2000 nm.

For an implementation of said embodiment for operating under SWIR, the gaze tracking apparatus of the present invention further comprises a light filter for blocking ambient light with $\lambda > \lambda_{co}$, where $\lambda_{co}$ is between 650 and 2000 nm, to avoid the image sensor receiving light with $\lambda > \lambda_{co}$ other than that coming from the SWIR light source. Said light filter is arranged on or attached to an outer face of the substrate, opposite to said inner face, or embedded in the surface between the image sensor and said outer face of the substrate.

For an embodiment, the pixels are so small (below 100 μm, but ideally below 10 μm) that they are invisible for the user whose eye is being gaze-tracked.

For an embodiment, a filter is added directly on top and/or below (in between said substrate and the pixel) each pixel (alternatively or in addition to the above mentioned light filter), to block all light below $\lambda_{co}$.

According to an embodiment, the gaze tracking apparatus of the present invention further comprises lenses covering the photo-active elements of the image sensor, wherein said lenses are at least partially transparent to visible light.

The gaze tracking apparatus of the present invention further comprises electrically conductive traces for electrically connecting at least the control unit and the image sensor, wherein said electrically conductive traces are arranged at least in part on the first area of the substrate, or of another substrate (lens, glass, window, etc.,) at least partially transparent to visible light and that is attached to or embedding said substrate.

Preferably, said electrically conductive traces are at least partially transparent to visible light.

Alternatively, said electrically conductive traces are opaque to visible light, but thin enough and distributed through the first area of the substrate with such a separation between them that allows a user to see through the first area of the substrate.

Due to the high photoconductive gain of the photodetectors of the image sensor (especially for the graphene-quantum dot photodetectors), the apparatus of the present invention does not need to include amplifiers on top or next the photodetectors.

Therefore, due to the partial or complete transparency of the image sensor, and associated elements (lenses, transparent traces), or, when is the case, of the non-blocking light arrangement of those associated elements (opaque traces), the apparatus of the present invention allows performing gaze tracking just in front of the user's eye, in contrast to the gaze tracking apparatuses of the prior art.

All the embodiments described above and below, regarding both the optoelectronic device of the present invention and the manufacturing method thereof, are valid for defining corresponding embodiments of the optoelectronic device (and manufacturing method thereof) included in the gaze tracking apparatus of the present invention.

BRIEF DESCRIPTION OF THE FIGURES

In the following some preferred embodiments of the invention will be described with reference to the enclosed Figures. They are provided only for illustration purposes without however limiting the scope of the invention.

DETAILED DESCRIPTION

Figure 1:
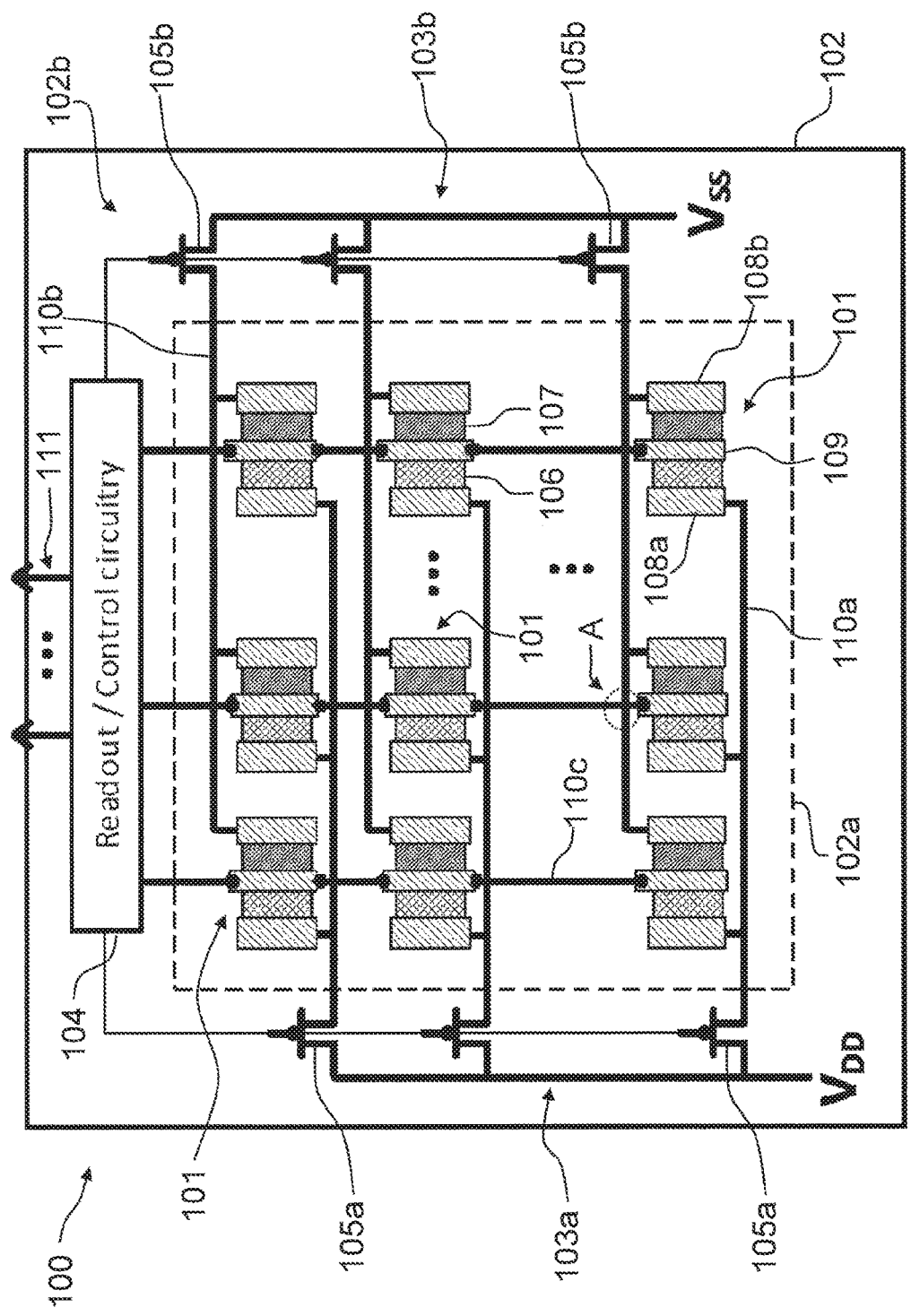
FIG. 1 is a schematic block diagram of an exemplary image sensor according to the present invention.

In FIG. 1 it is illustrated a schematic block diagram of an embodiment of an image sensor with non-local readout circuit according to present invention. The image sensor 100 comprises a plurality of pixels 101 arranged as a two-dimensional array of M rows and N columns on a first area 102a of a substrate 102. In particular, FIG. 1 corresponds to a bottom plan view of the image sensor 100, that is, as seen through the substrate 102.

The image sensor 100 further comprises a control unit operatively connected to the plurality of pixels 101 and adapted to selectively bias said pixels and read them out. The control unit comprises a first biasing circuit 103a for providing a first biasing voltage $V_{DD}$, a second biasing circuit 103b for providing a second biasing voltage $V_{SS}$, the second biasing voltage $V_{SS}$ being substantially symmetrical to the first biasing voltage $V_{DD}$, and a readout circuit 104 for reading out the photo-signal generated by the light impinging on the pixels 101. The control unit also includes a plurality of output nodes 111 operatively connected to the readout circuit 104.

The first biasing circuit 103a and the second biasing circuit 103b comprise, respectively, first selection means 105a and second selection means 105b to selectively bias one or more pixels 101 of said plurality that are to be read out at a given time. The first selection means 105a and the second selection means 105b are arranged outside the first area 102a of the substrate 102 and, as illustrated in the example of FIG. 1, comprise a plurality of switches (implemented as gate-controlled transistors).

Each pixel 101 of the plurality of pixels comprises a photo-active element 106 and a non photo-active reference element 107 disposed proximate to the photo-active active element 106. Moreover, each pixel 101 further comprises a first contact 108a circuitally connected to the first biasing circuit 103a, a second contact 108b circuitally connected to the second biasing circuit 103b, and an output contact 109 circuitally connected to the readout circuit 104.

The photo-active element 106 is circuitally connected between the first contact 108a and the output contact 109, while the reference element 107 is circuitally connected between the output contact 109 and the second contact 108b. The reference element 107 has a dark conductance that substantially matches the dark conductance of the photo-active element 106, making it possible to substantially suppress the dark current generated in the photo-active element 106 during the exposure cycle.

Figure 2A:
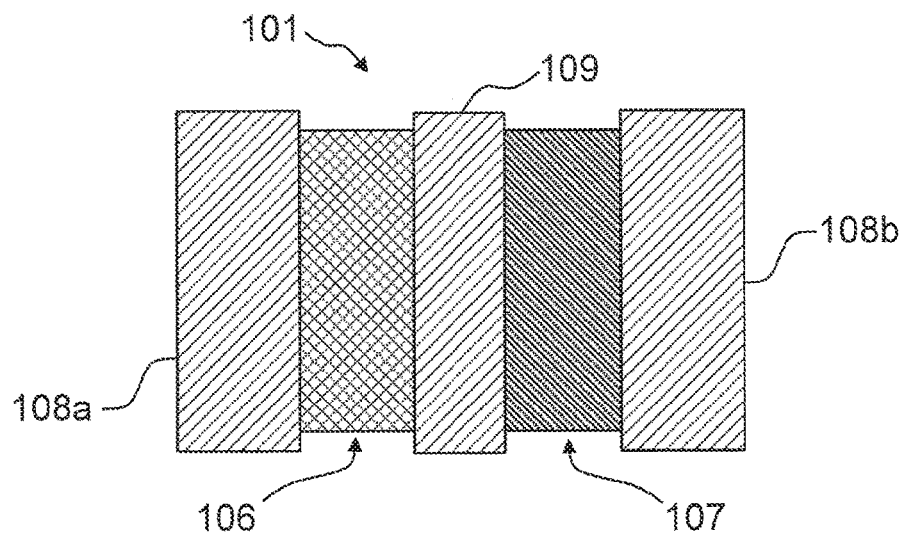
FIGS. 2a and 2b correspond to a bottom plan view and a cross-sectional view of a pixel for the image sensor of FIG. 1, in which the first, second and output contacts of the pixel are disposed below the transport layer of the photo-active element and the transport layer of the reference element of the pixel.
Figure 2B:
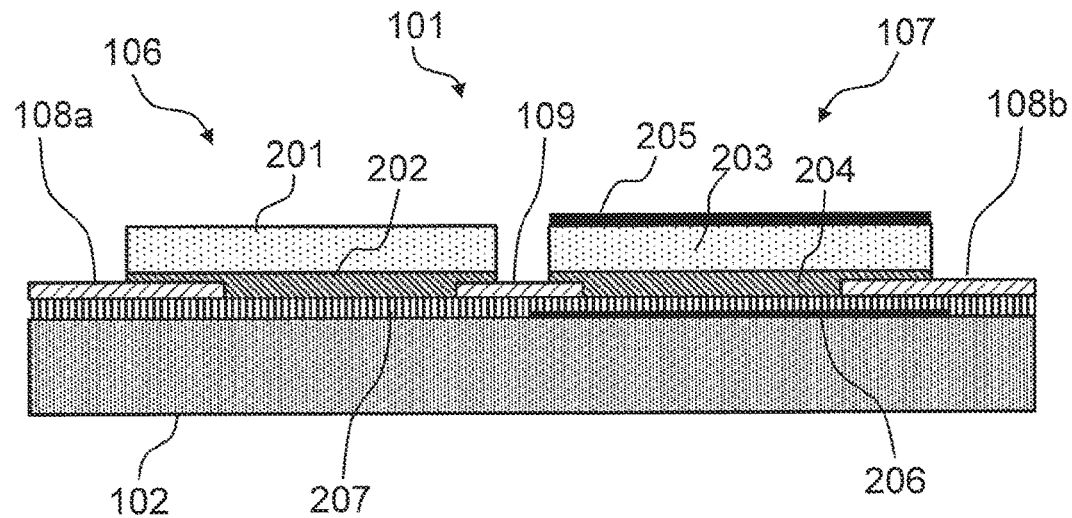

As it can be seen in greater detail in the cross-sectional view of FIG. 2b, the photo-active element 106 comprises a photosensitizing layer 201 associated to a transport layer 202 that includes at least one layer of a two-dimensional material. Similarly, the reference element 107 also comprises a photosensitizing layer 203 associated to a transport layer 204 that includes at least one layer of a two-dimensional material.

In this example the photosensitizing layer 201 of the photo-active element 106 and the photosensitizing layer 203 of the reference element 107 are disposed above (and, in particular, directly above) the transport layer 202 and 204 respectively. However, in other examples the photosensitizing layer of the photo-active element or that of the reference element can be disposed below its corresponding transport layer.

The image sensor 100 further comprises first conductive traces 110a and second conductive traces 110b that connect the first biasing circuit 103a and the second biasing circuit 103b with, respectively, the first contact 108a and the second contact 108b of the pixels. In the example of the FIG. 1, said first and second conductive traces 110a, 110b extend horizontally across the first area 102a of the substrate from the first and second biasing circuits 103a, 103b located on the leftmost and rightmost portions of the substrate 102, outside the first area 102a.

Additionally, the image sensor 100 also comprises third conductive traces 110c (which in FIG. 1 extend along the vertical direction) that connect the output contacts 109 of the pixels in a daisy-chain configuration with the readout circuit 104, which is arranged in the uppermost portion of the substrate 102, outside said first area 102a.

The substrate 102 is made of a flexible and transparent material, such as for example PET or PEN. In addition, the first contact 108a, the second contact 108b and the output contact 109 of the pixels 101, and said conductive traces 110a, 110b, 110c, are made of a transparent conducting oxide, such as for instance ITO.

In the image sensor 100, the first biasing circuit 103a, the second 103b, and the readout circuit 104 (the three of them being comprised in the control unit of the image sensor 100) are arranged on a second area 102b located on the periphery of the same substrate 102, hence not overlapping the first area 102a on which the plurality of pixels 101 are arranged. However, in other examples, the control unit may be arranged on different substrate provided in the image sensor.

Referring now to FIGS. 2a and 2b, it is shown the layout of a pixel 101 of the image sensor 100 in which the photo-active element 106 is arranged next to the reference element 107 on a same level. In this example, the transport layer 202 of the photo-active element 106 and the transport layer 204 of the reference element 107 are coplanar. The first contact 108a and the output contact 109 (at opposite ends of the photo-active element 106) are disposed below the transport layer 202, while the second contact 108b and the output contact 109 (at opposite ends of the reference element 107) are disposed below transport layer 204.

The reference element 107 further comprises a first light-blocking layer 205 disposed above the photosensitizing layer 203 and the transport layer 204, and a second light-blocking layer 206 disposed below said photosensitizing layer 203 and said transport layer 204. In particular, the first light-blocking layer 205 is disposed directly above the photosensitizing layer 203, while the second light-blocking layer 206 is separated from the transport layer 204 by an insulating layer 207. The first and second light-blocking layers 205, 206 are passivation layers comprising an oxide.

Figure 3A:
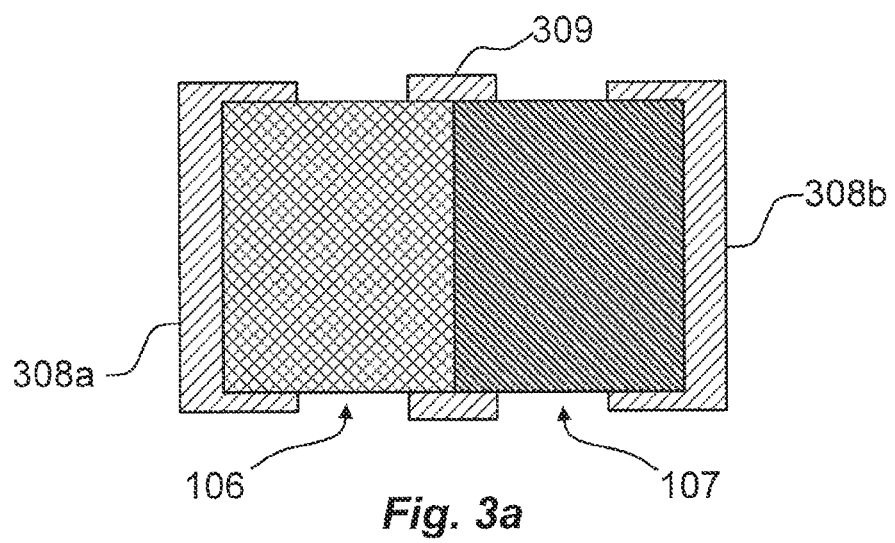
FIGS. 3a and 3b show, in a bottom plan view and a cross-sectional view, an alternative pixel layout for the image sensor of FIG. 1, in which the first, second and output contacts of the pixel are disposed above the transport layer of the photo-active element and the transport layer of the reference element of the pixel.
Figure 3B:
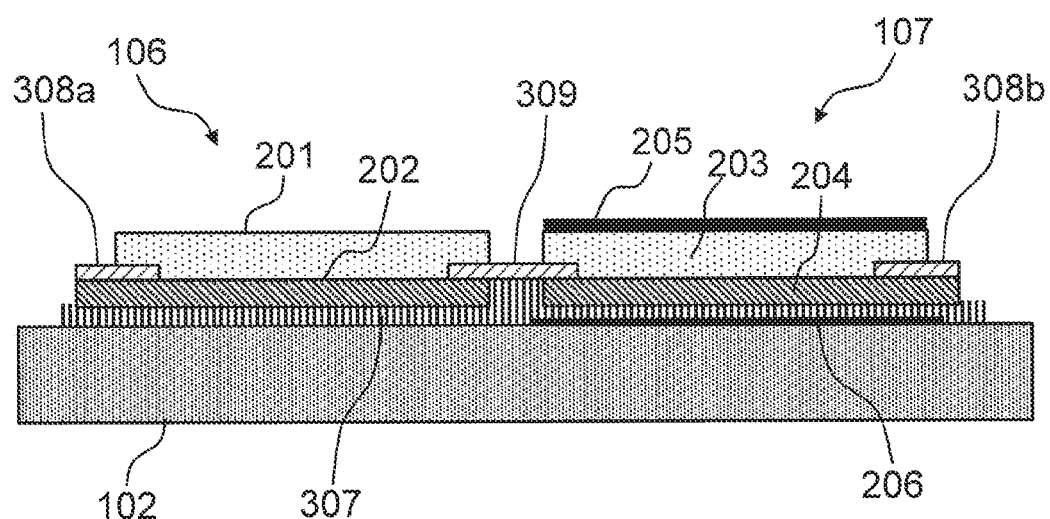

FIGS. 3a and 3b depict an alternative example of a pixel layout than can be used in the image sensor 100 of FIG. 1. For simplicity, elements in common with the pixel structure of FIGS. 2a and 2b have been labeled with the same reference numerals. The photo-active element 106 is circuitally connected between a first contact 308a and an output contact 309, while the reference element 107 is circuitally connected between the output contact 309 and a second contact 308b. Conversely to the case illustrated in FIGS. 2a and 2b, now the first contact 308a and the output contact 309 are disposed above the transport layer 202, more specifically between said transport layer 202 and the photosensitizing layer 201. In the same way, the second contact 308b and the output contact 309 are disposed above the transport layer 204, between said transport layer 204 and the photosensitizing layer 203.

The transport layers 202, 204 are spaced from the substrate 102 by means of an insulating layer 307, which provides mechanical support for the deposition of the output contact 309 in the region between said transport layers 202, 204.

Referring back to FIG. 1, it can be observed that the first and second conductive traces 110a, 110b cross at a number of places the third conductive traces 110c. To avoid the electrical contact between different conductive traces, the third conductive traces 110c are raised to pass above the first and second conductive traces 110a, 110b. An intervening insulating layer further prevents the electrical contact between traces. For this reason, the third conductive traces 110c advantageously comprise a vertical portion (such as a via) through the intervening insulating layer to make ohmic connection with the output contact 109 of the pixels.

Figure 9:
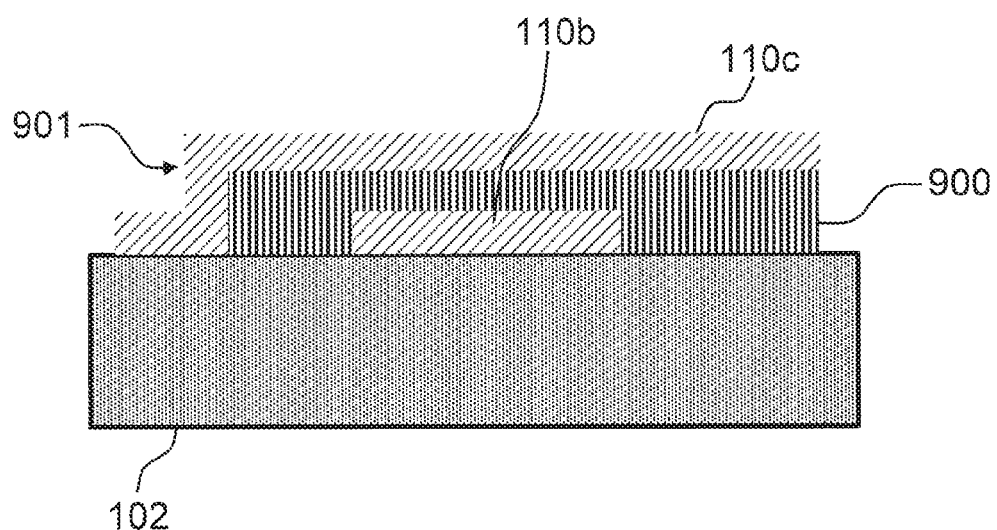
FIG. 9 is a detailed representation, in a cross-sectional view, of area A in FIG. 1 in which it is illustrated the crossing of different conductive traces.

One of such crossings, in particular the one occurring in region A of the image sensor of FIG. 1, is illustrated in the cross-sectional view of FIG. 9, in which a third conductive trace 110c crosses above a second conductive trace 110b, both traces being spaced by an intervening insulating layer 900. The third conductive trace 110c comprises a vertical portion 901 that goes through the intervening insulating layer 900 to reach the level on which the output contact 109 of the pixels are arranged.

Alternatively, the pixels of the image sensor may advantageously have the first and second contacts 108a, 108b disposed below the transport layers 202, 204, and the output contact 109 disposed above the transport layers 202, 204. In this case, as the first and second conductive traces 110a, 110b will always be below the third conductive traces 110c, electrical contact between traces is avoided. Moreover, the third conductive traces 110c might no longer require vertical portions to make ohmic connection with the output contact 109 of the pixels. Nevertheless, even in this case, it is still preferred to have an intervening insulating layer to further isolate the first and second conductive traces from the third conductive traces.

Figure 4:
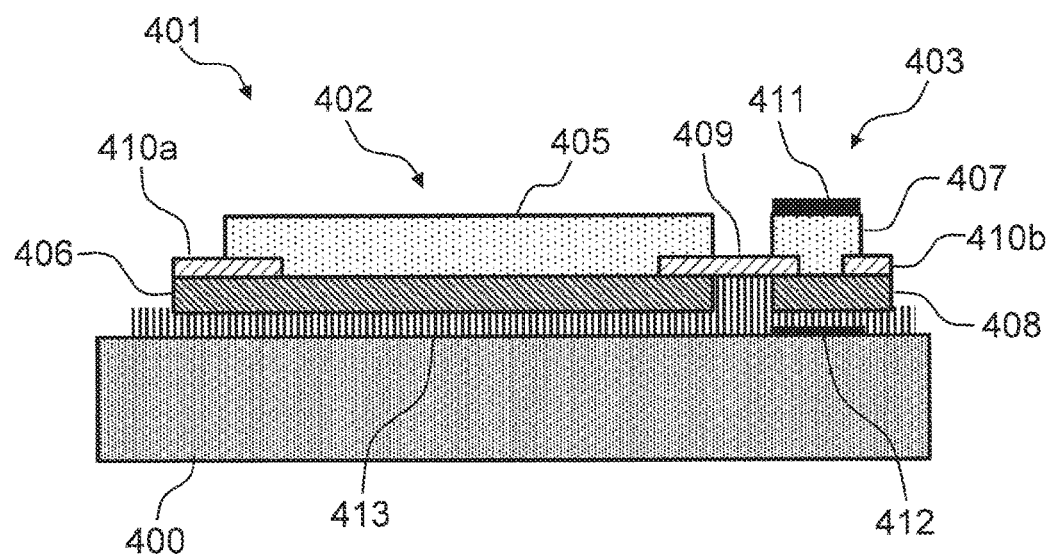
FIG. 4 depicts a cross-sectional view of a pixel for an image sensor according to the present invention, in which the transport layer of the reference element of the pixel has a smaller area than the transport layer of the photo-active element of said pixel.

Referring now to FIG. 4, it is there shown in a cross-sectional view another example of a pixel suitable for an image sensor in accordance with the present invention. In particular, a pixel 401 is arranged on a substrate 400 and comprises photo-active element 402 and a reference element 403 disposed one next to the other in a coplanar configuration. The photo-active element 402 is circuitally connected between a first contact 410a and an output contact 409, while the reference element 403 is circuitally connected between the output contact 409 and a second contact 410b. Moreover, an insulating layer 413 has been provided on the substrate 400, below photo-active element 402 and a reference element 403.

The photo-active element 402 comprises a photosensitizing layer 405 associated to a transport layer 406, which is disposed below the photosensitizing layer 405 and includes at least one layer of a two-dimensional material. Likewise, the reference element 403 also comprises a photosensitizing layer 407 associated to another transport layer 408, which is disposed below the photosensitizing layer 407 and includes at least one layer of a two-dimensional material. The first contact 410a, second contact 410b, and output contact 409 are sandwiched between the photosensitizing layers 405, 407 and the transport layers 406, 408.

In this example, the transport layer 408 of the reference element has a smaller area than the transport layer 406 of the photo-active element, advantageously reducing the overhead in real estate due to the presence of the reference element 403 in the pixel 401. Despite being smaller in size, the transport layer 408 has the same shape as the transport layer 406 in order to ensure that the dark conductance of the reference element 403 substantially matches the dark conductance of the photo-active element 402.

Finally, as in the previous examples, the reference element 403 also comprises a first light-blocking layer 411 disposed above the photosensitizing layer 407 and a second light-blocking layer 412 disposed below the transport layer 408, so that the absorption of the incident light in the reference element 403 is prevented.

Figure 5:
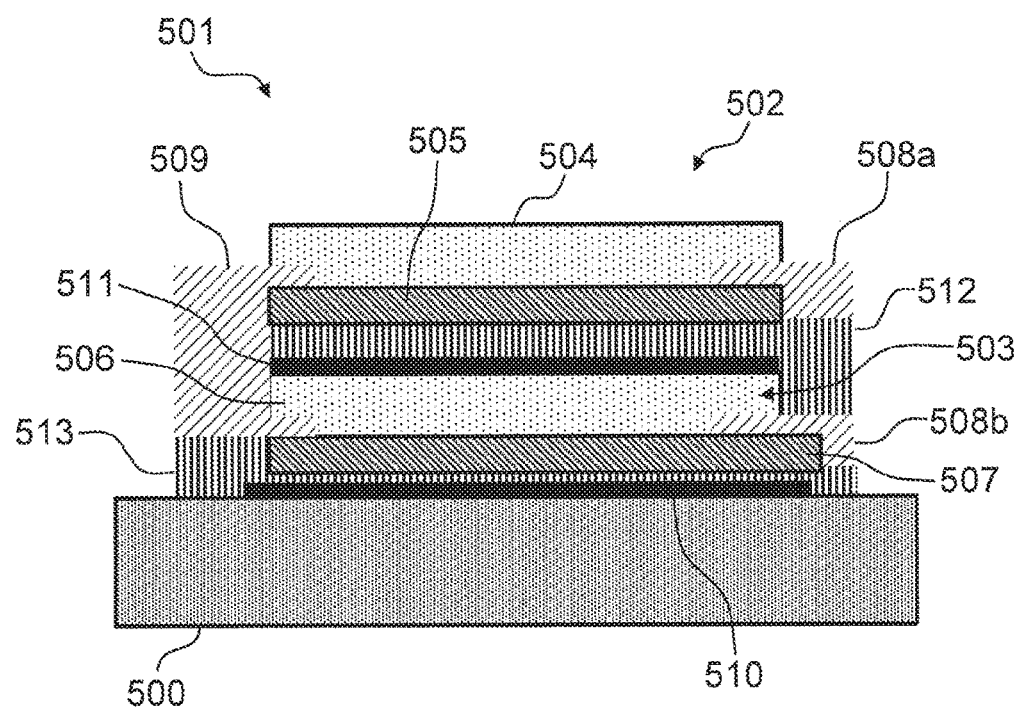
FIG. 5 corresponds to a cross-sectional view of a pixel suitable for an image sensor in accordance with the present invention, in which the reference element of the pixel is arranged below the photo-active element of said pixel.

A further example of a pixel suitable for an image sensor according to the invention is depicted in FIG. 5, in which a pixel 501 is disposed on a substrate 500 and comprises a reference element 503 arranged below a photo-active element 502, resulting in very compact architecture with reduced footprint.

The photo-active element 502 comprises a photosensitizing layer 504 disposed above a transport layer 505. Below the photo-active element 502, the reference element 503 also comprises a photosensitizing layer 506 disposed above another transport layer 507. A primary insulating layer 512 associated to the photo-active element 502 is arranged between the photo-active element 502 and the reference element 503, to provide isolation between the two elements.

The reference element 503 comprises a first light-blocking layer 511 disposed above the its photosensitizing layer 506 and a second light-blocking layer 510 disposed below the transport layer 507, separated from said transport layer 507 by means of secondary insulating layer 513.

The way of contacting the photo-active element 502 and the reference element 503 is somewhat different from what it has been described above for the previous examples. A first contact 508a and a second contact 508b are provided at different levels on a same side of the pixel (namely, on the right-hand side in FIG. 5) and are circuitally connected to a first end of the photo-active element 502 and of the reference element 503 respectively.

On the opposite side of the pixel 501 (on the left-hand side in the Figure), a common output contact 509 is circuitally connected to a second end of the photo-active element 502 and of the reference element 503. The output contact 509 comprises a vertical portion that extends from the transport layer 505 of the photo-active element to the transport layer 507 of the reference element.

The geometry of the photo-active elements of the previous examples can be defined via patterning of the transport layer, which allows either maximizing the light-collection area or tailoring specific aspect ratios for the optimization of different performance parameters (such as for instance, but not limited to, noise, responsivity, and resistance).

FIGS. 6a-6b and 7a-7b represent two pixel configurations based on the example already discussed in the context of FIGS. 3a-3b in which the pixel additionally comprises back-gate contacts.

Figure 6A:
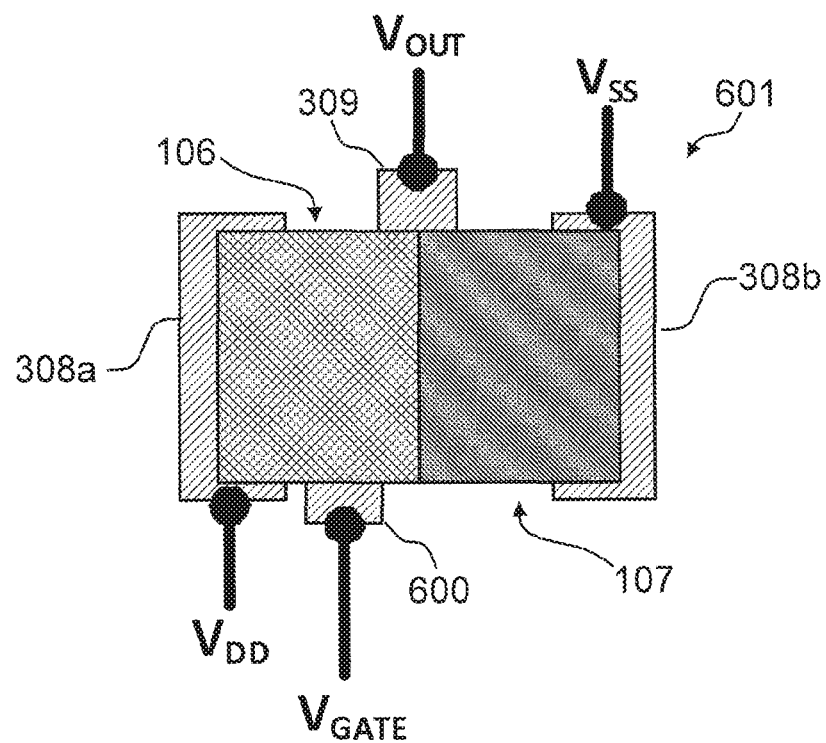
FIGS. 6a and 6b are a bottom plan view and a cross-sectional view of a pixel for an image sensor according to the present invention, in which the pixel comprises a back-gate contact below the photo-active element.
Figure 6B:
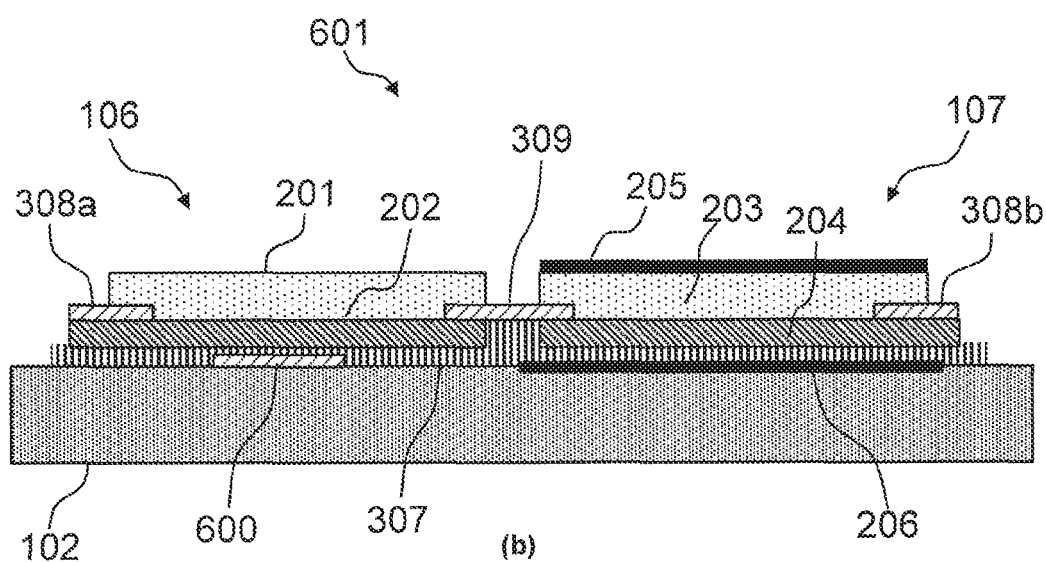

In the example of FIGS. 6a-6b, the pixel 601 comprises back-gate contact 600 disposed below the photo-active element 106, between the insulating layer 307 and the substrate 102. In this case, the insulating layer 307 is as a primary insulating layer associated to the photo-active element 106 which, together with the back-gate contact 600, allows finely controlling the conduction and photosensitivity of said photo-active element 106.

As shown in FIG. 6a, the pixel 601 is a four-terminal device having the first contact 308a and the second contact 308b adapted to be circuitally connected, respectively, to first and second biasing circuits providing substantially symmetrical first and second biasing voltages $V_{DD}$, $V_{SS}$; the output contact 309 adapted to be circuitally connected to a readout circuit to deliver the photo-signal $V_{OUT}$ generated at the pixel; and the back-gate contact 600 to provide a gating voltage $V_{GATE}$ to the photo-active element 106.

Figure 7A:
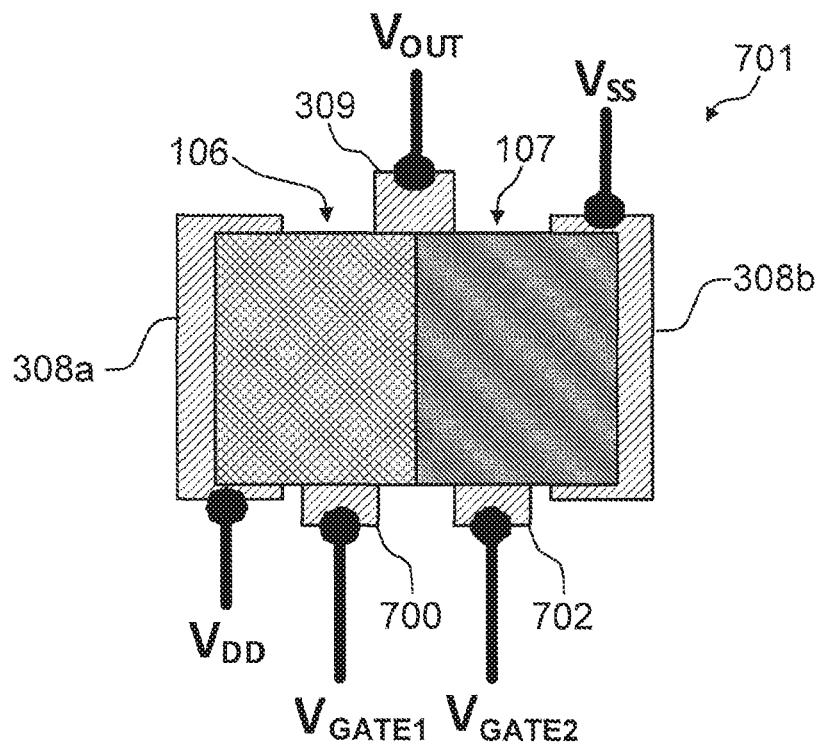
FIGS. 7a and 7b depict a bottom plan view and a cross-sectional view of another pixel for an image sensor according to the present invention, in which the pixel comprises a back-gate contact below each of the photo-active element and the reference element.
Figure 7B:
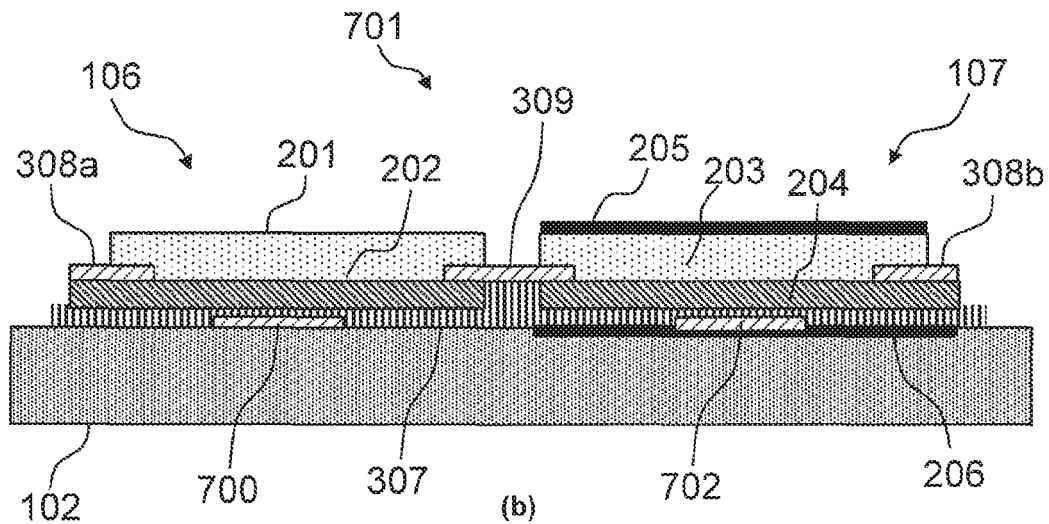

FIGS. 7a-7b show another example of a pixel comprising back-gate contacts. The pixel 701 has a layout similar to that of pixel 601, but differs in that it comprises not only a back-gate contact 700 disposed below the photo-active element 106 (between the insulating layer 307 and the substrate 102) but also an additional back-gate contact 702 disposed below the reference element 107. Said additional back-gate contact 702 is arranged between the insulating layer 307 and the second light-blocking layer 206.

Now, the insulating layer 307 is, at the same time, a primary insulating layer associated to the photo-active element 106 but also a secondary insulating layer associated to the reference element 107. Although in this particular example the primary and secondary insulating layers are embodied as a same insulating layer, in other examples they can be different layers arranged at a same or different levels in the layout structure of the image sensor.

The resulting pixel 701 can be operated as a five-terminal device in which its first and second contacts 308a, 308b are adapted to be circuitally connected, respectively, to first and second biasing circuits providing first and second biasing voltages $V_{DD}$, $V_{SS}$ and its output contact 309 is adapted to be circuitally connected to a readout circuit to deliver the photo-signal $V_{OUT}$ generated at the pixel 701. Additionally, the back-gate contact 700 is conFigured to provide a gating voltage $V_{GATE1}$ to the photo-active element 106 to fine-tune, for example, its photosensitivity, while the back-gate contact 702 is adapted to provide a gating voltage $V_{GATE2}$ to the reference element 107 to adjust its conductance.

Although in these examples the pixels 601, 701 are provided with back-gate contacts only, in other examples they may comprise, additionally or alternatively, top-gate contacts.

Figure 8A:
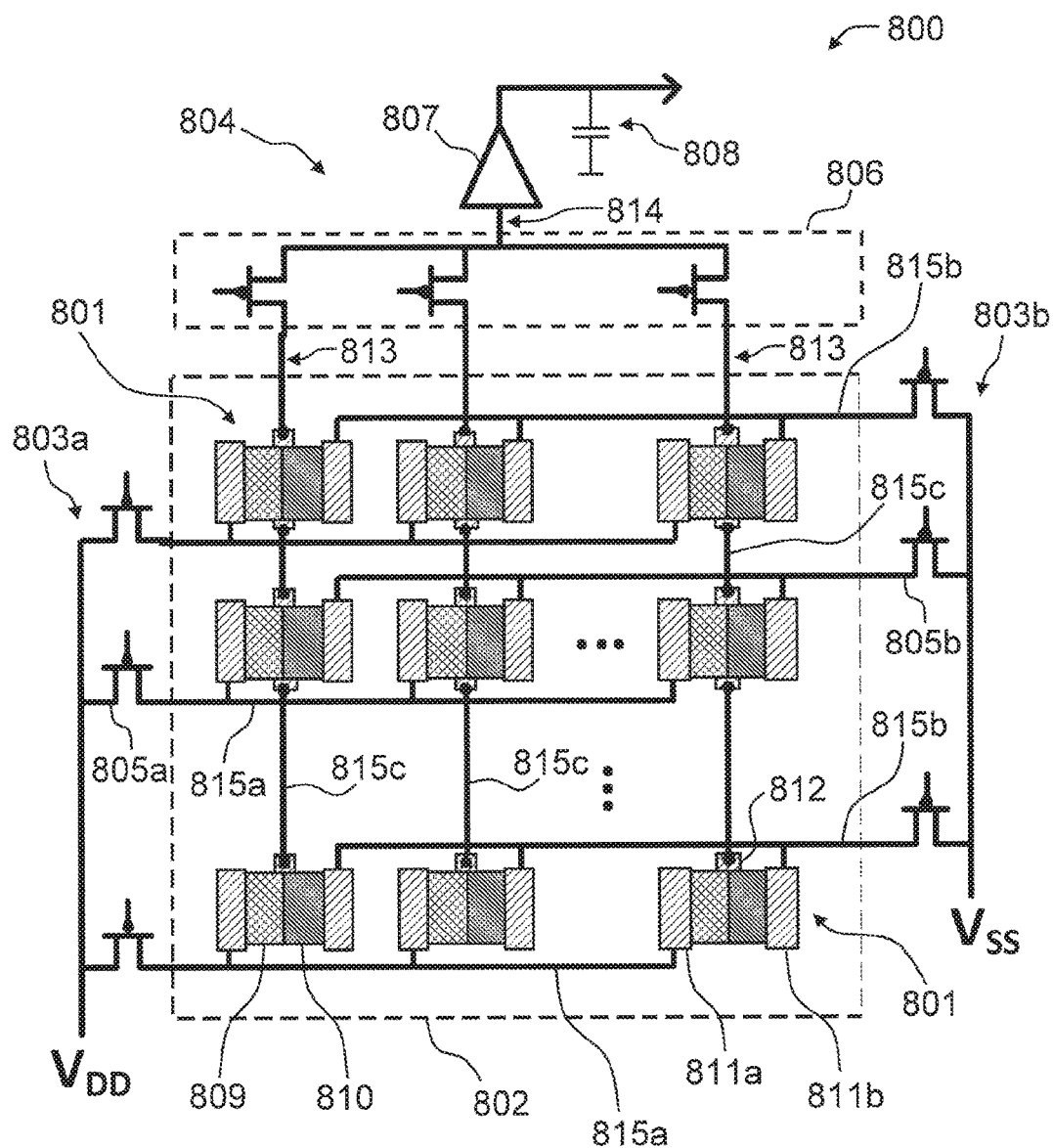
FIG. 8a shows a schematic block diagram of an embodiment of an image sensor according to the present invention in which the readout circuit comprises a multiplexer followed by an amplifier and a storage element cascaded thereto.

Referring now to FIG. 8a, it is there shown, in a bottom plan view, the block diagram of an image sensor of the present invention. The image sensor 800 comprises a plurality of pixels 801 arranged as a two-dimensional array comprising a plurality of rows, each comprising the same number of pixels, aligned defining a plurality of columns. The plurality of pixels 801 are arranged on a first area 802 of a substrate (not depicted in the Figure).

The image sensor 800 comprises a control unit operatively connected to the plurality of pixels 801, which includes a first biasing circuit 803a for providing a first biasing voltage $V_{DD}$, a second biasing circuit 804b for providing a second biasing voltage $V_{SS}$, and a readout circuit 804. In particular, the second biasing voltage $V_{SS}$ is substantially symmetrical to the first biasing voltage $V_{DD}$.

The first biasing circuit 803a and the second biasing circuit 803b comprise, respectively, first row-select switches 805a and second row-select switches 805b to selectively bias the rows of the array.

The first and second row-select switches 805a, 805b make it possible to sequentially enable only one row of the array at a time while leaving the other rows disabled, which allows to daisy-chain the pixels 801 of each column of the array to the readout circuit 804, as it can be observed in FIG. 8a. This greatly simplifies the interconnection of the pixels 801 to the readout circuit 804 and reduces the power consumption of the image sensor 800 during operation.

Each pixel 801 comprises a photo-active element 809 circuitally connected between a first contact 811a and an output contact 812, and a reference element 810 circuitally connected between the output contact 812 and a second contact 811b. The structure of the pixels 801 is the same as the one for the pixels 101, which has already been described in detail above in the context of the image sensor 100 in FIG. 1.

The image sensor 800 further comprises first conductive traces 815a and second conductive traces 815b that connect the first biasing circuit 803a and the second biasing circuit 803b with, respectively, the first contact 811a and the second contact 811b of the pixels.

The readout circuit 804 includes a multiplexer 806 (depicted as a plurality of switches) that comprises as many input terminals 813 as there are pixels 801 in each row and an output terminal 814. Each input terminal 813 is circuitally connected to the output contact 812 of a pixel of each row (in particular the pixels forming a column) by means of third conductive traces 815c provided in the image sensor 800.

The readout circuit further comprises an amplifier 807 operatively connected in series to the output terminal 814 of the multiplexer, and a storage element 808 operatively connected in series to the amplifier 807 and conFigured to store a voltage proportional to the photo-signal generated in a pixel 801 of the plurality of pixels.

Upon readout, the control unit activates only one first row-select switch 805a and only one second row-select switch 805b at a time, biasing with balanced voltages only one row of pixels 801 of the array, while the pixels in the other rows remain disabled.

In this manner, only the pixels 801 in the selected row load the input terminals 813 of the multiplexer 806. This makes it possible for a pixel 801 of the selected row to be connected to the corresponding input terminal 813 of the multiplexer 804 by means of the output contacts 812 of the other pixels arranged in the same column as said pixel, and the third conductive traces 815c connecting said output contacts 812. Then, the photo-signal generated in each pixel 801 of the selected row can reach the readout circuit 804 without being disturbed by the pixels in the other rows.

Figure 8B:
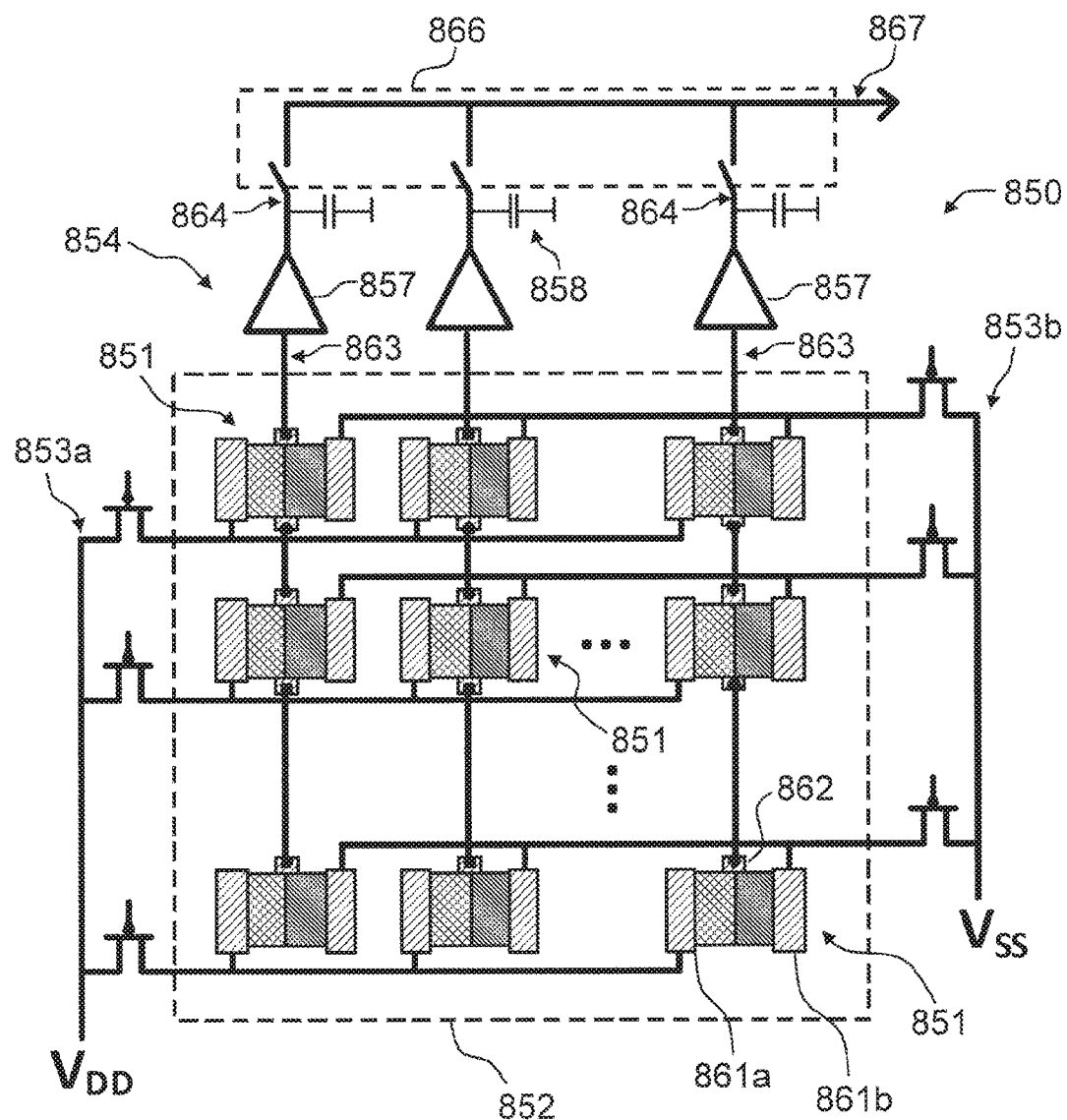
FIG. 8b is a schematic block diagram of another embodiment of an image sensor according to the present invention in which the readout circuit comprises as many amplifiers as there are pixels in each row of the array of pixels and a storage element connected in series to the output node of each amplifier.

FIG. 8b shows another example of an image sensor that is similar in topology to the one just described in the context of FIG. 8a but with an alternative readout circuit design. The image sensor 850 comprises a plurality of pixels 851 arranged on a first area 852 of a substrate and operatively connected to a control unit that includes a first and a second biasing circuits 853a, 853b circuitally connected, respectively, to first and second contacts 861a, 861b of each pixel, and a readout circuit 854 circuitally connected to an output contact 862 of each pixel. The structure of the pixels, and that of the first and second biasing circuits of the image sensor 850 are similar to the ones comprised in the image sensor 800 and already described above.

The readout circuit 854 comprises as many amplifiers 857 as there are pixels 851 in each row, that is, the readout circuit 854 comprise an amplifier 857 for each column. Each amplifier 857 has an input terminal 863, circuitally connected to the output contact of a pixel 851 of each row, and an output terminal 864. In addition, the readout circuit 854 also comprises a storage element 858 that is connected in series to the output terminal 864 of each amplifier and conFigured to store a voltage proportional to the photo-signal generated in the pixels.

Additionally, the control unit of the image sensor 850 includes an interconnection circuit 866 (a multiplexer in the example of FIG. 8b), operatively connected to the readout circuit 854 and that comprises an output node 867. The interconnection circuit 866 allows to circuitally connect, through the readout circuit 854, the output contact 862 of any of the pixels of the array with the output node 867.

The image sensor 100 with non-local readout circuit described above in the context of FIGS. 1, 2a and 2b can be manufactured by means of a method that comprises the steps of:

a) providing a transport layer 202 including at least one layer of a two-dimensional material, and a photosensitizing layer 201 associated to a transport layer 201, on a first area 102a of a substrate 102;

b) providing a first biasing circuit 103a, a second biasing circuit 103b and a readout circuit 104 in the control unit, the first biasing circuit 103a providing a first biasing voltage $V_{DD}$, the second biasing circuit 103b providing a second biasing voltage $V_{SS}$ substantially symmetrical to the first biasing voltage, and the readout circuit 104 being adapted to read out the photo-signal generated by the light impinging on the pixels 101;

c) arranging first selection means 105a and second selection means 105b provided, respectively, in the first biasing circuit 103a and the second biasing circuit 103b outside the first area 102a of the substrate, the first selection means 105a and second selection means 105b being adapted to selectively bias one or more pixels 101 of said plurality that are to be read out at a given time;

For each pixel 101 of the plurality of pixels, the method further comprises:

d) defining a photo-active element 106 at a selected location of the transport layer 202 and the photosensitizing layer 201 arranged on the first area 102a of the substrate, and circuitally connecting the photo-active element 106 between a first contact 108a and an output contact 109 provided in said pixel 101;

e) arranging a non photo-active reference element 107 proximate to the photo-active active element 106 of said pixel, the reference element 107 having a dark conductance that substantially matches the dark conductance of the photo-active element 106, and circuitally connecting the reference element 107 between said output contact 109 and a second contact 108b provided in said pixel 101;

f) circuitally connecting the first contact 108a, the second contact 108b, and the output contact 109 of said pixel 101 to, respectively, the first biasing circuit 103a, the second biasing circuit 103b, and the readout circuit 104 of the control unit.

FIGS. 10a-10g present the different steps involved in the process of fabrication of the pixel 101 shown in FIGS. 2a-2b.

Figure 10A:
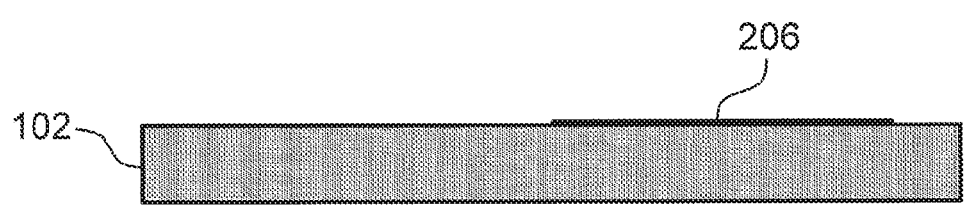
FIGS. 10a-10g depict the different steps in the process of fabrication of a pixel of the image sensor of FIG. 1.
Figure 10B:
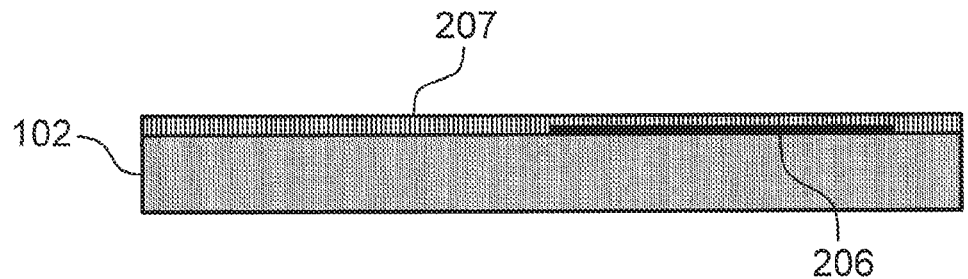
Figure 10C:
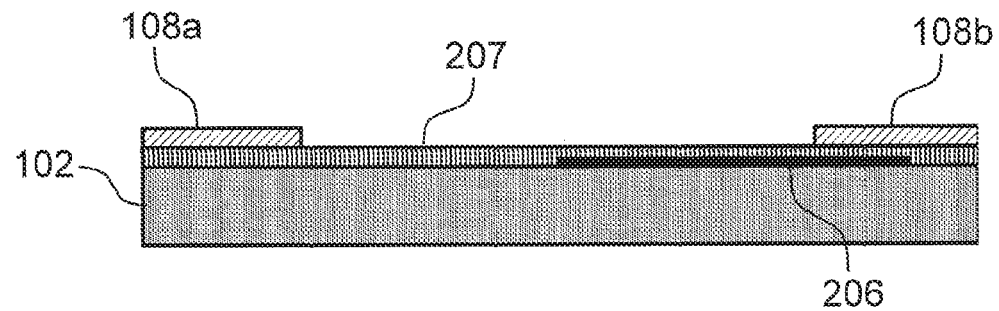
Figure 10D:
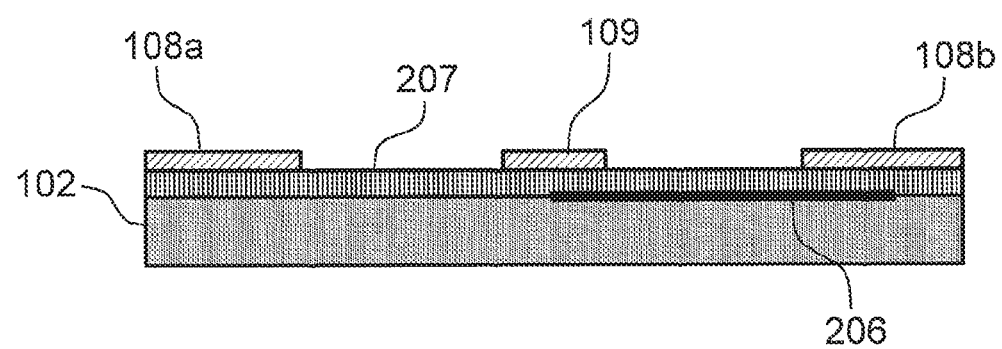
Figure 10E:
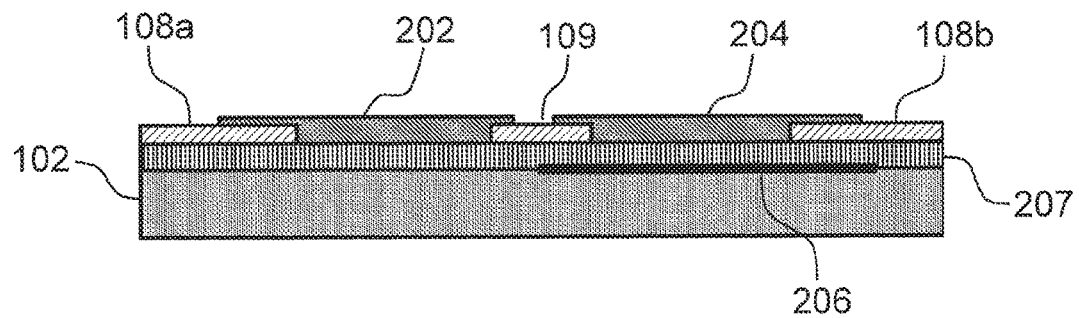

In first place, as it can be seen in FIG. 10a, the second light blocking layer 206 is selectively deposited, for example by means of a photomask as used in conventional photolithographic process, on top of the substrate 102 only in the area that will be occupied by the reference element 107 of the pixel 101. Next (FIG. 10b), a passivation layer comprising an oxide is uniformly grown over the substrate to obtain the insulating layer 207, which covers the second light-blocking layer 206 and prepares the substrate for the deposition of the contacts of the pixel 101.

At this stage, the first contact 108 and the second contact 108b are defined at opposite ends of the pixel 101, together with the first conductive trace 110a and the second conductive trace 110b (not shown in FIG. 10c) to provide the first and second biasing voltages $V_{DD}$, $V_{SS}$. Before defining the output contact 109 (illustrated in FIG. 10d) connected through its corresponding third trace 110c to the readout circuit 104, it is necessary to grow an intervening insulating layer (such as the one described with reference to FIG. 9) to avoid the electrical contact where the conductive traces 110a, 110b, 110c cross.

Afterwards, one or more layers of a two-dimensional material are progressively deposited on the substrate. Then, the transport layer 202 of the photo-active element 106 and the transport layer 204 of the reference element 107 are etched, one next to the other, between the contacts 108a, 108b, 109 previously defined (see FIG. 10e).

Figure 10F:
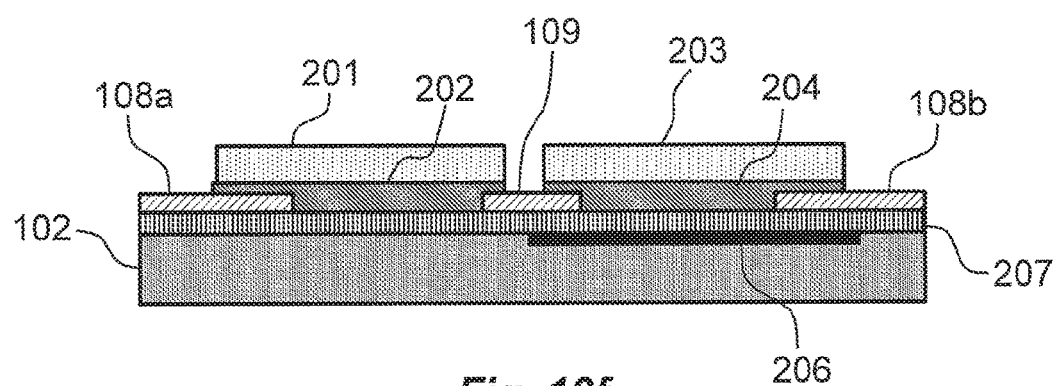

Next, FIG. 10f shows the deposition of a photosensitizing material on top of the one or more layers of two-dimensional material, on which the photosensitizing layer 201 of the photo-active element 106 and the photosensitizing layer 203 of the reference element 107 are patterned above their corresponding transport layer 202, 204.

Figure 10G:
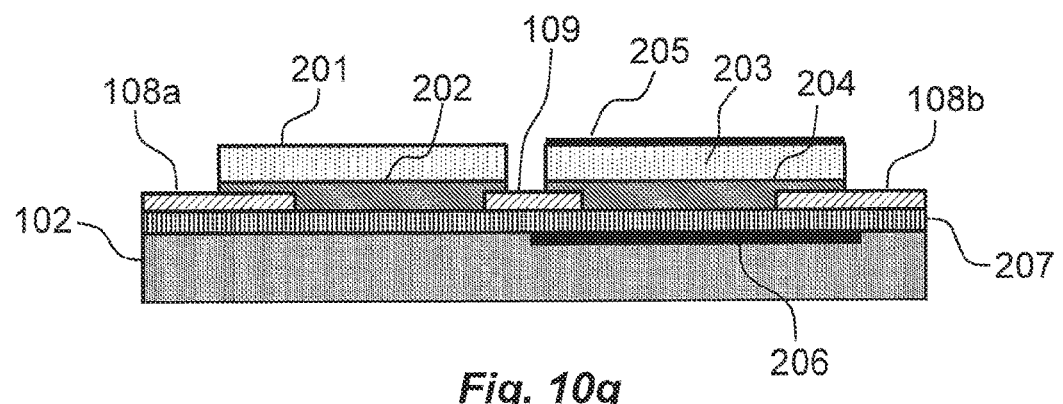

Finally, the first light-blocking layer 205 is laid out selectively on top of the photosensitizing layer 203 of the reference element, as depicted in FIG. 10g. Optionally, at this final stage, a protective encapsulation layer made of a wide-bandgap dielectric material can be disposed above the pixel 101.

The process of fabrication of the pixel shown in FIGS. 3a-3b would be essentially similar to the one just discussed, with the only difference that the deposition of the one or more layers of the two-dimensional material, and the subsequent etching of the transport layers 202, 204, would be carried out prior to the definition of the contacts 108a, 108b, 109.

Figure 11:
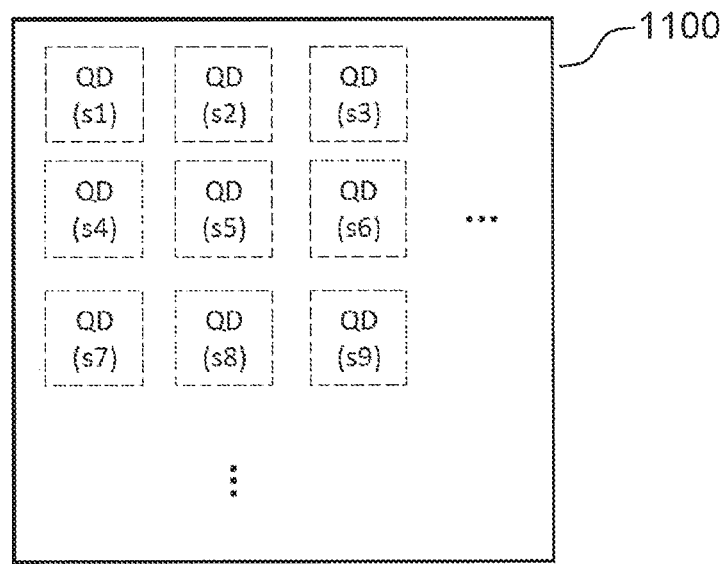
FIG. 11 is a schematic representation of an exemplary image sensor in which its pixels are grouped into clusters, each cluster being sensitive to a different range of the spectrum.

Referring now to FIG. 11, it is there shown an example of an image sensor capable of multispectral response. The image sensor 1100 comprises a plurality of pixels arranged as a two-dimensional array and grouped into clusters s1-s9. Each cluster comprises at least one pixel having a photo-active element with a photosensitizing layer sensitive to a different range of the spectrum. In this particular example, the photosensitizing layer of the photo-active elements comprises quantum dots, whose size is progressively varied to tune their light absorption properties to different wavelengths.

Figure 13A:
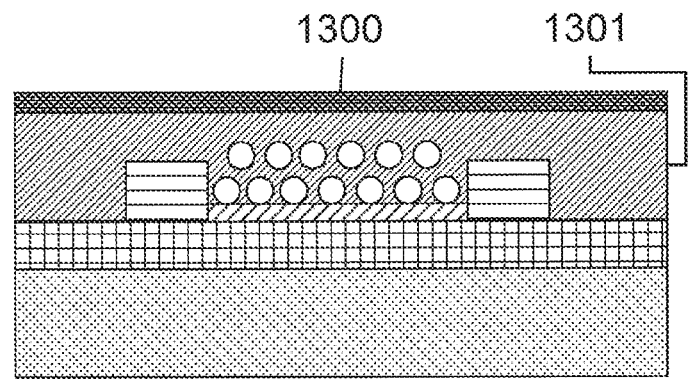
FIGS. 13a and 13b are, respectively, a side view and a plan view of the image sensor of the present invention for an embodiment for which a light-concentrating structure is arranged on top of the image sensor.
Figure 13B:
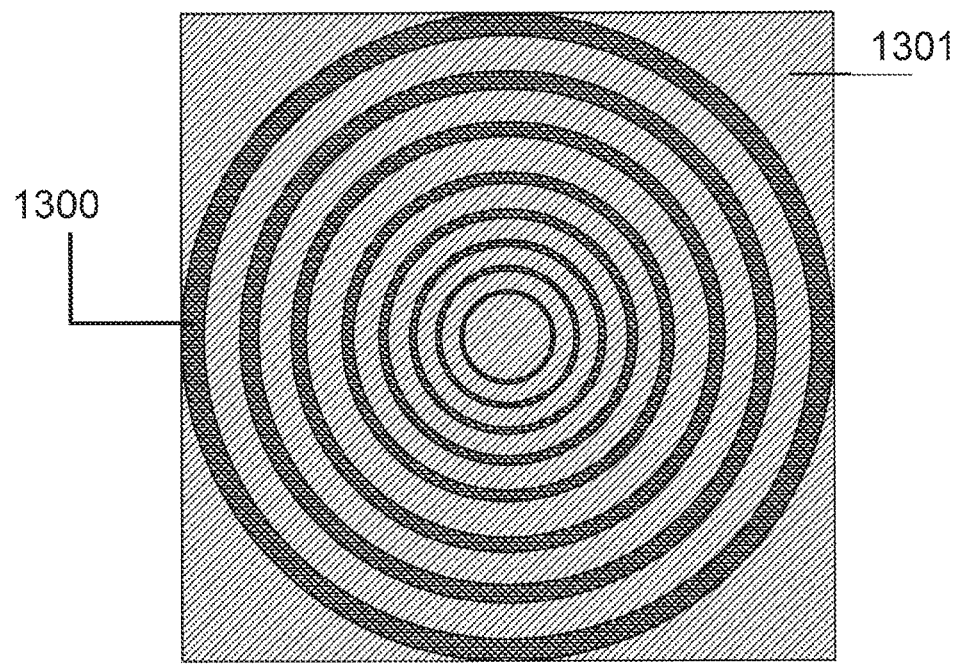

Referring to FIGS. 13a and 13b, they show a further embodiment of the image sensor of the present invention for which a light-concentrating structure 1300 is arranged on top of the image sensor (above each pixel or above some of its pixels), specifically on top of an insulating layer 1301 disposed above the photosensitive element (for a non illustrated embodiment, it could be arranged directly on top of the image sensor, without an insulated layer in between), in order to enhance the response of the photosensitive element. For the illustrated embodiment, the light-concentrating element 1300 is a plasmonic bull's eye metallic structure, although alternatively other geometries of plasmonic and/or dielectric structures that may consist of metals, dielectrics, heavily doped semiconductors or graphene can be used, the choice of which is determined by the spectral range intended to be covered by the image sensor.

Figure 14A:
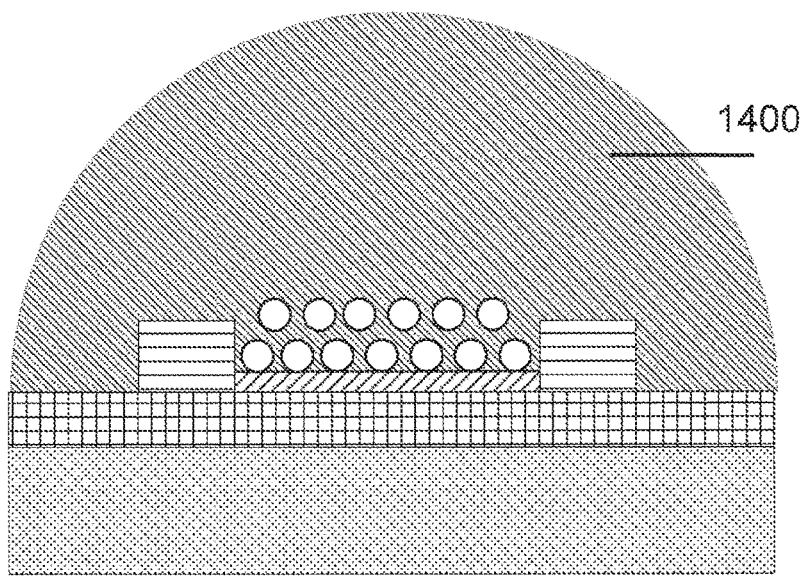
FIGS. 14a and 14b are, respectively, a side view and a plan view of the image sensor of the present invention for an embodiment for which a micro-lens is arranged on top of each pixel.
Figure 14B:
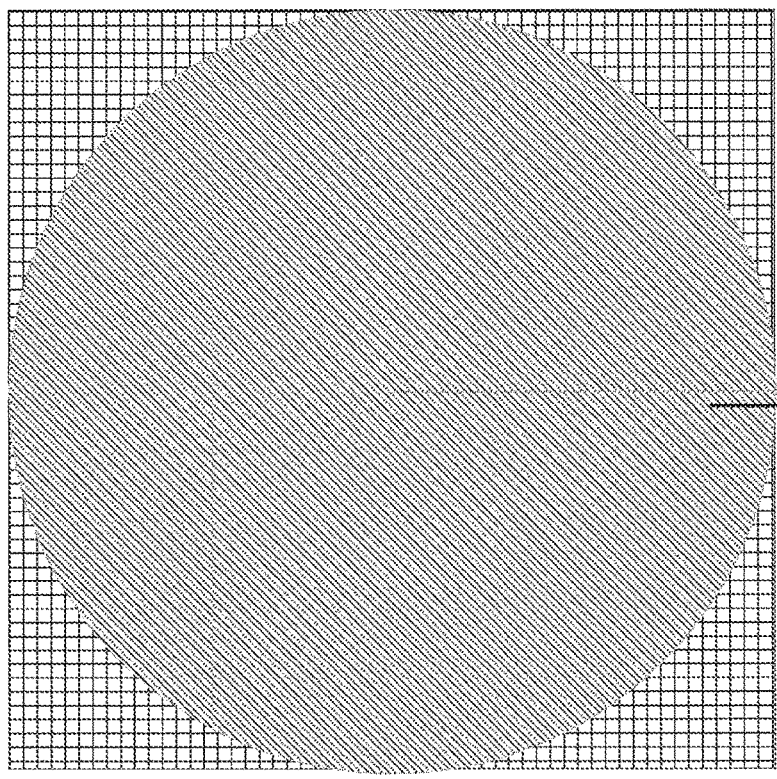

For the embodiment of FIGS. 14a and 14b, the response of the photosensitive element is further enhanced by adding a so-called microlens 1400 on top of each pixel (only one pixel is shown in the Figure).

Figure 15:
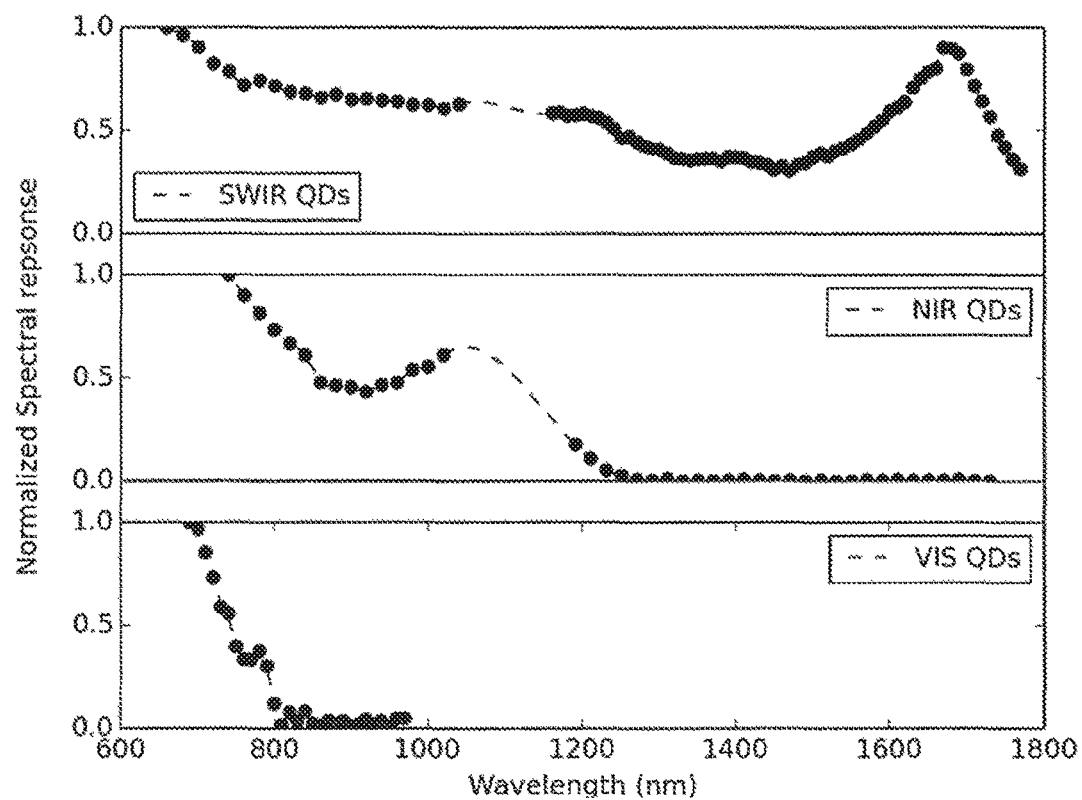
FIG. 15 is a plot showing the normalized spectral response of three different pixels of the image sensor of the present invention for an embodiment for which the image sensor is capable of multispectral response by the inclusion therein of pixels with photosensitizing layers sensitive to different ranges of the light spectrum, comprising quantum dots (QD) having different sizes (per pixel), where the curves relate to Short-wave Infrared (SWIR), Near Infrared (NIR) and visible light (VIS).

To demonstrate the spectral tunability of the photosensitive elements of the image sensor of the present invention, a prototype has been built including an arrangement comprising several pixels differing between them in that they are conFigured for being sensitive to different ranges of the light spectrum, in this case by means of the selection of the quantum dots (specifically the sizes thereof) which form their respective photosensitizing layers, one of which is conFigured for being sensitive to Short-wave Infrared light (SWIR), another for Near Infrared light (NIR) and another for visible light (VIS). The resulting waves are depicted in FIG. 15, identified as SWIR-QDs, NIR-QDs and VIS-QDs.

Figure 16:
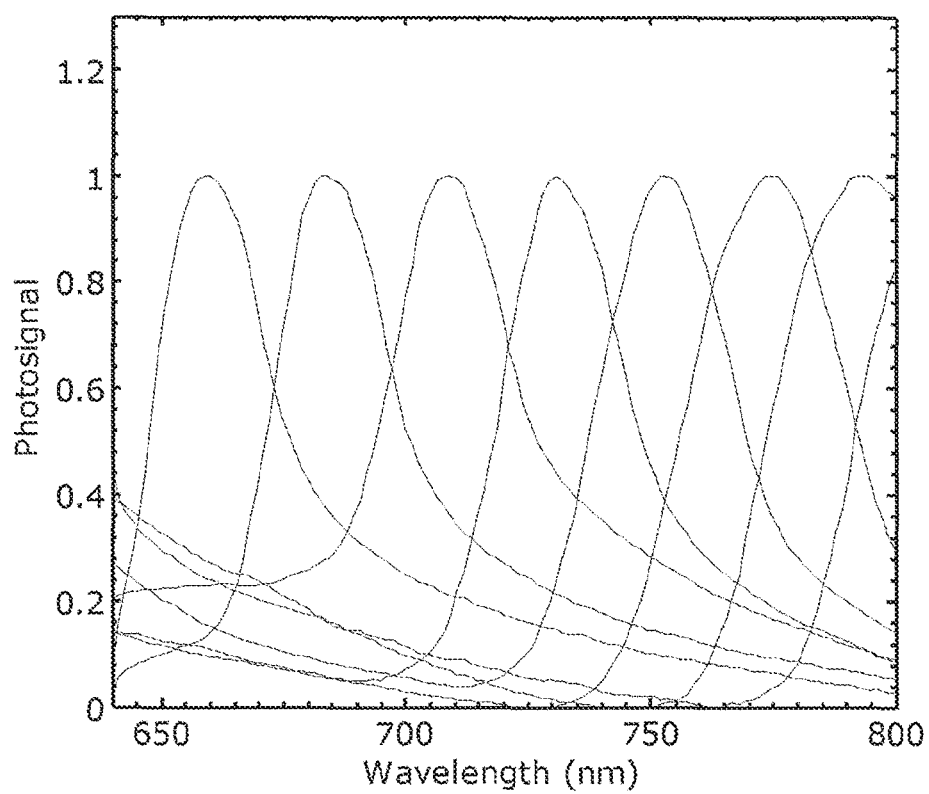
FIG. 16 shows several curves representative of data obtained from a pixelated detector built according to the image sensor of the present invention where the light is transmitted through a diffractive optics system before it hits the pixelated detector. Each curve corresponds to data obtained when the combined system (diffractive optics coupled to the pixelated detector according to the present invention) is illuminated with light of a specific wavelength (corresponding to the wavelength where the maximum in each curve occurs).

In the plot of FIG. 16 data from a pixelated detector built according to the image sensor of the present invention and that is illuminated with diffracted light is shown, said data showing how the present invention allows measuring the spectral decomposition of the impinging light.

Figure 17:
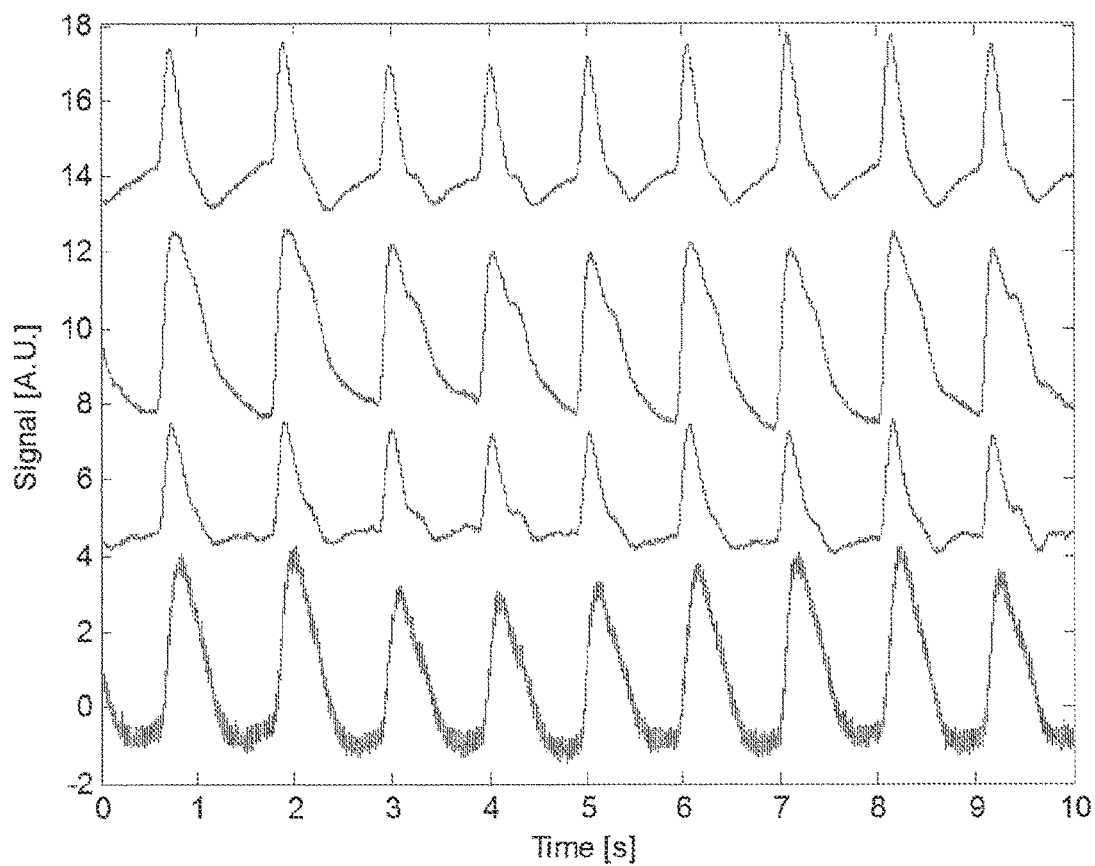
FIG. 17 shows several curves representative of data extracted from a 4-pixel photodetector linear array according to the image sensor of the present invention, arranged on a flexible and transparent substrate.

In the plot of FIG. 17 data extracted from a graphene 4-pixel photodetector linear array on a flexible and transparent substrate is shown. The sensors of the array have a 1×1 mm$^2$ dimension and a pixel pitch of 1.3 mm. The data is obtained by performing a reflective photoplethysmogram measurement on the finger of a person using a green (532 nm) light emitting diode as the light source. Each of the four depicted curves correspond to a different colour.

Figure 12:
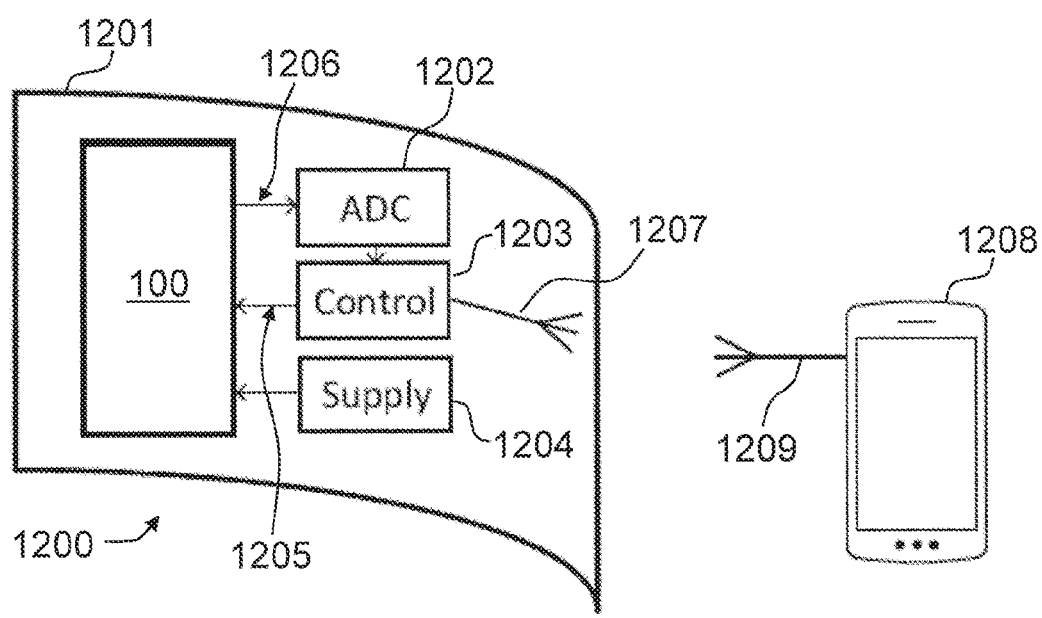
FIG. 12 shows a block diagram of an optoelectronic device in accordance with an embodiment of the present invention.

FIG. 12 represents the block diagram of an optoelectronic device, in particular a wireless wearable device, which incorporates a photodetector array according to the present invention.

The optoelectronic device 1200 comprises the image sensor 100 described in FIG. 1 arranged on a flexible and/or stretchable substrate 1201, together with an analog-to-digital converter 1202, a control module 1203 and a power supply module 1204 operatively connected to the control unit of the image sensor 100.

The control module 1203 is conFigured to provide control signals 1205 to the control unit of the image sensor 100 to selectively bias and read out the pixels 101, and to receive a plurality of detected values 1206 corresponding to the photo-signals read out from the plurality of pixels 101 by the readout circuit 104. The analog-to-digital converter 1202 is circuitally connected between the image sensor 100 and the control module 1203 and is adapted to digitize the detected values 1206 before they are delivered to the digital circuitry embedded in the control module 1203.

The power supply module 1204 is conFigured to provide the first and second biasing voltages $V_{DD}$, $V_{SS}$ to the first and second biasing circuits 103a, 103b and to energize the active devices of the readout circuit 104.

The optoelectronic device 1200 further comprises an antenna 1207 operatively interfaced with an RF-circuit included in the control module 1203, and that allows the optoelectronic device 1200 to communicate via a wireless connectivity standard (such as WiFi, Bluetooth or ZigBee) with a user terminal 1208 provided with an antenna 1209, such as a mobile telephone. The wireless link between the optoelectronic device 1200 and the user terminal 1208 is advantageously used to program the optoelectronic device 1200 remotely from the user terminal 1208, and to transfer data (such as for instance raw and/or processed data relating to the detected values 1206 corresponding to the photo-signals read out from the pixels 101).

Figure 18:
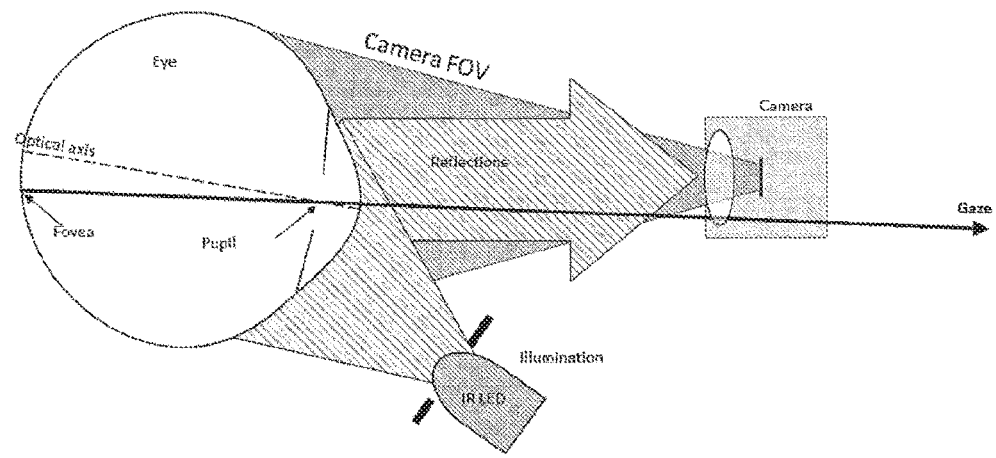
FIG. 18 schematically shows a gaze tracking principle, according to a conventional gaze tracking apparatus and approach.

FIG. 18 schematically shows a gaze tracking principle, according to a conventional gaze tracking apparatus and approach, for active IR illumination. The problem is that the camera has to be placed sufficiently close to eye to capture enough IR light at sufficiently high resolution, while not blocking the user's vision. Demands are high resolution and high Q.E. (quantum efficiency).

Figure 19:
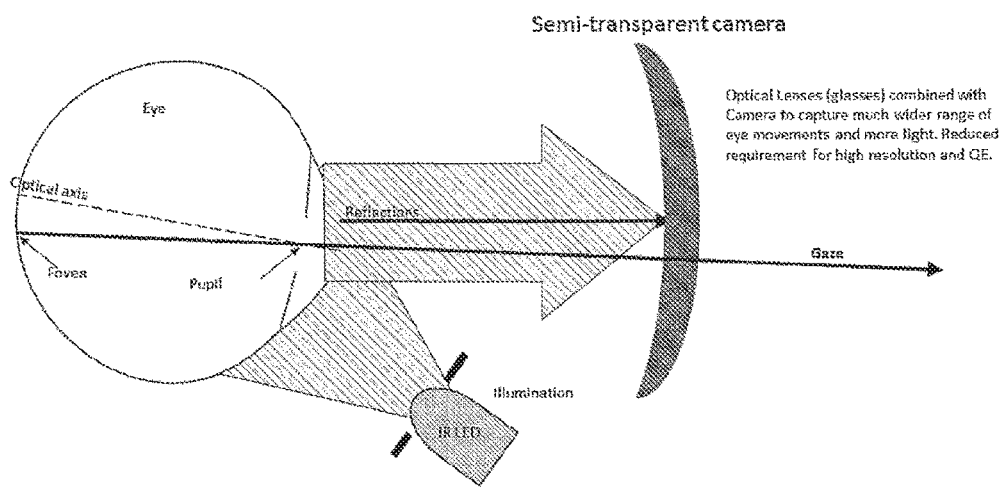
FIG. 19 schematically shows part of the gaze tracking apparatus of the present invention (some elements have been omitted, such as the control unit, electrically conductive traces, etc.), for an embodiment, and the operation thereof to achieve an improved gaze tracking process.

FIG. 19 schematically shows part of the gaze tracking apparatus of the present invention (some elements have been omitted, such as the control unit, electrically conductive traces, etc.), for an embodiment, and the operation thereof to achieve an improved gaze tracking process. The optical lenses with integrated array of photodetectors (image sensor) capture a much wider range of eye movements and more light. There is a reduced requirement for resolution and high Q.E. Moreover, the apparatus of the present invention can operate with eye-safe infrared light ((>1.1 um, for example 1.5 μm). The ability to operate in this wavelength range also avoids any distraction by the active illumination.

The present inventors have built a prototype of the gaze tracking apparatus of the present invention for which the image sensor is an IR camera fabricated directly on a polycarbonate lens (or on an interspersor) using Graphene Quantum Dot photodetection technology. The IR camera covers all or a portion of the entire lens, is semi-transparent and has a built-in photoconductive gain. The user cannot see the camera, but the camera is an integral part of the glass lenses.

Figure 20:
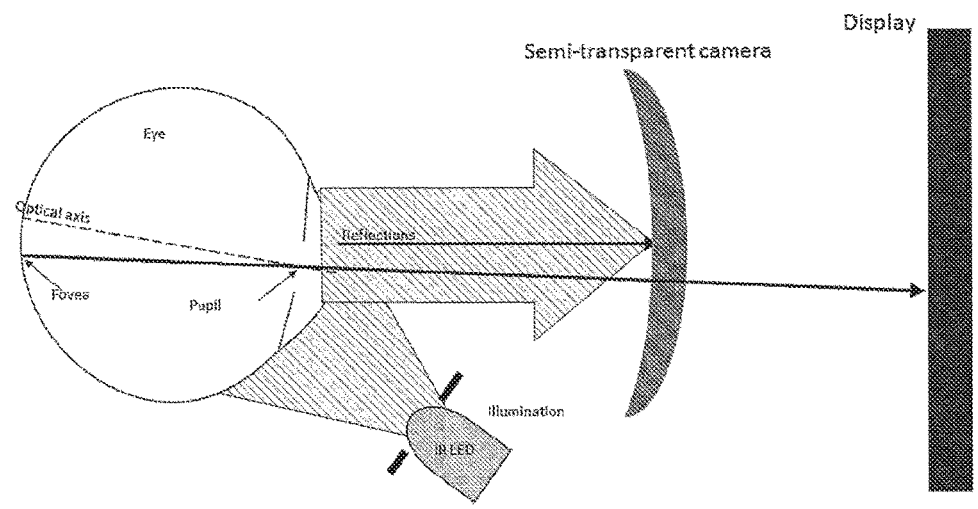
FIG. 20 schematically shows part of the gaze tracking apparatus of the present invention, for another embodiment, and the operation thereof, for a virtual reality application.

The main challenge for a semi-transparent camera is to deal with ambient light. For the design of the above mentioned prototype, the preset inventors focused on the technological solutions for dealing with this ambient light applied to gaze tracking based on a semi-transparent camera that is disposed in between the eye-ball and the object of interest. In FIG. 20, the different light paths involved are schematically drawn together with a schematic representation of the built prototype.

In FIG. 20, four main light sources impinging on the semi-transparent camera are identified:
1. Ambient light, $\lambda < \lambda_{co}$
2. Ambient light, $\lambda < \lambda_{co}$, reflected from the eye-ball
3. Ambient light, $\lambda > \lambda_{co}$, reflected from the eye ball
4. Reflected light from active illumination Source 1 does not contain useful information for gaze tracking purposes. Sources 2-4 contain gaze information. Source 2 however, cannot be disentangled from source 1 and hence cannot be used for gaze tracking.

The pixels of the camera can be made of a transport layer and a sensitizing layer. Hybrid photodetectors can be made transparent and can be fabricated on a transparent substrate such as a lens. The lens also contains a short pass filter that blocks all ambient light with $\lambda > \lambda_{co}$. This short pass filter is placed in between the camera and the object of interest.

The camera of the built prototype is characterized in the following:
1. Semi-transparent (>80% transmission) to visible light ($\lambda < \lambda_{co}$).
2. Rejects ambient light (sunlight, room light, etc.) influences on the reading
3. Can be selective to a wavelength or a band of wavelengths with $\lambda > \lambda_{co}$.
4. Preferably is sensitive in the eye-safe wavelength range between 1300-2000 nm.

The camera of the built prototype can reject ambient light influences using the following techniques:
1. Active illumination with a wavelength $> \lambda_{co}$ that induces more signal than the ambient light of source 1.
2. Modulated active illumination and lock-in type readout.
3. Enhance the selectivity of the detectors for the wavelength of the active illumination ($\lambda > \lambda_{co}$) over the ambient light of source 1. We can use one of the following techniques to enhance the spectral selectivity of the sensors:
   Plasmonic filter with a central wavelength that matches the wavelength of the active illumination on the pixels of the camera.
   Multilayer thin film optical cavity filter that enhances absorption of the wavelength of the active illumination and reduces the absorption in the visible range.

Organic sensitizing layer on the hybrid photodetector with a second order transition with an energy <1.71 eV.

The active light source preferably has a wavelength in the eye-safe region between 1300 nm and 2000 nm.

If the spectral selectivity is significant, we can envision using only light source 3 (reflected ambient light with $\lambda > \lambda_{co}$) for capturing gaze information. This can reduce power consumption of the full system dramatically.

Figure 25:
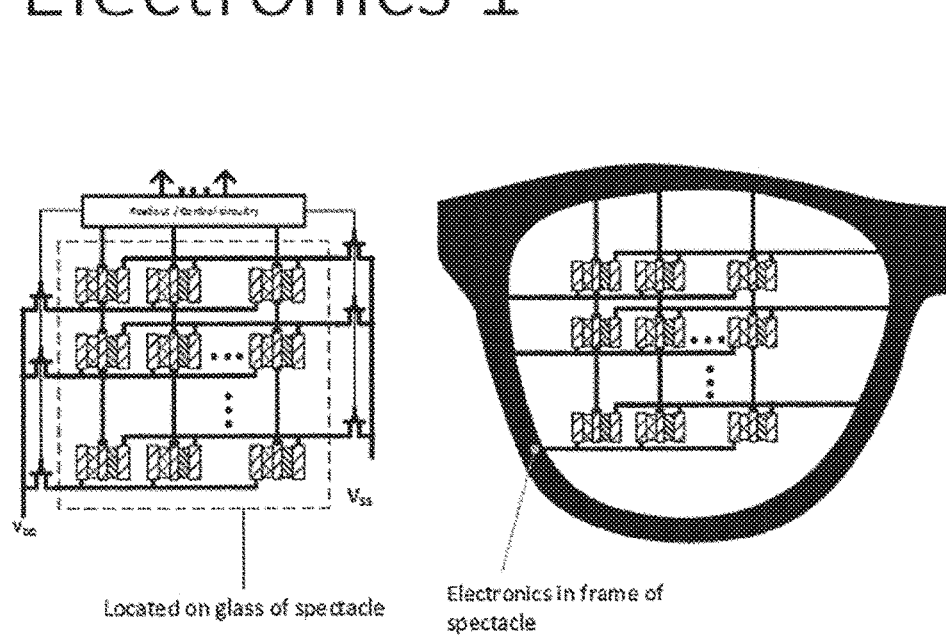
FIGS. 25 and 26 show, for two different embodiments of the apparats of the present invention, schematic diagrams of the electronics and photodetector array circuitry of the optoelectronic device thereof. The glass (transparent) part of the spectacles only contains transparent conductive traces and photodetectors. All the active control and read-out components are located outside of the glass part of the spectacles (for example in the frame). The diagrams of FIG. 25 shows a 3-terminal read-out scheme implementation (similar to those of FIGS. 8a and 8b) and the bottom diagrams of FIG. 26 show a 2-terminal implementation (the one shown in FIG. 1).
Figure 26:
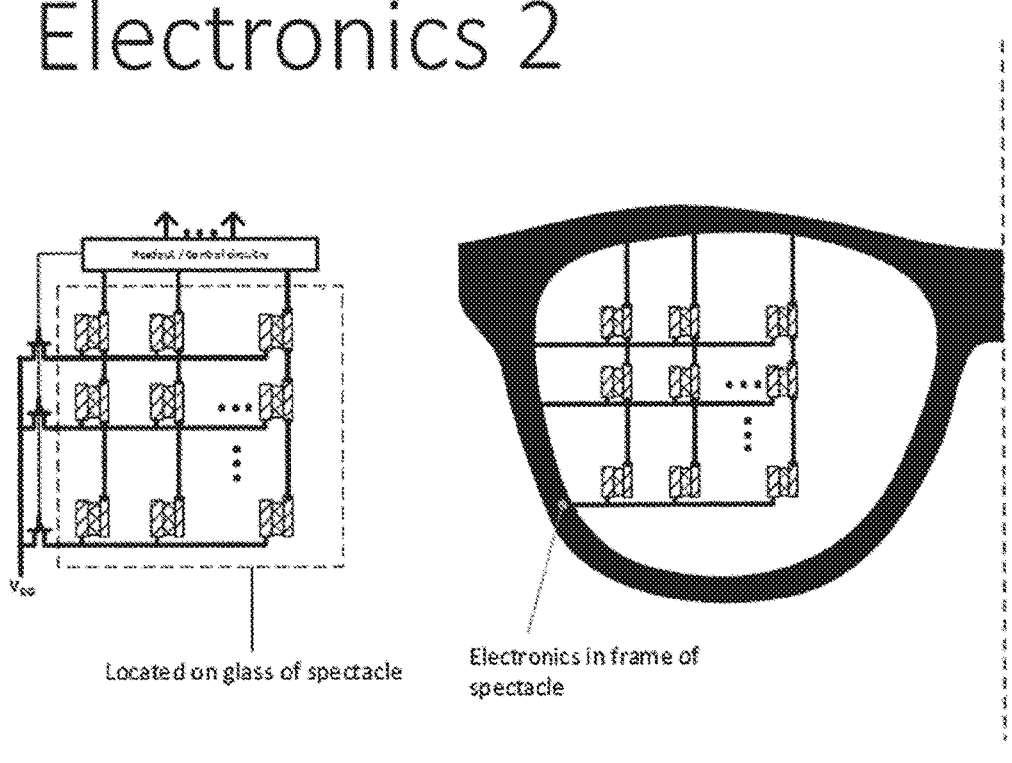

The electronics to read, interpret and process the sensors images are located away from the lens (such as in the frame of the eyeglasses, or of a windows or of a screen), as is illustrated in FIGS. 25 and 26. The glass of the spectacles (or of a window or screen) only contains transparent conductive wiring (or very thin and much distanced traces), semi-transparent photodetectors and miniature lenses covering the photodetectors. The built-in photoconductive gain of the photodetectors of the image sensor (especially for the graphene quantum dot photodetectors) enables the above described non-local read-out, i.e. to perform the read-out away from the photodetectors.

Implementations

As already indicated in a previous section of the present document, the gaze tracking apparatus of the present invention can be implemented on different devices as is illustrated in FIGS. 20 to 23.

Figure 21:
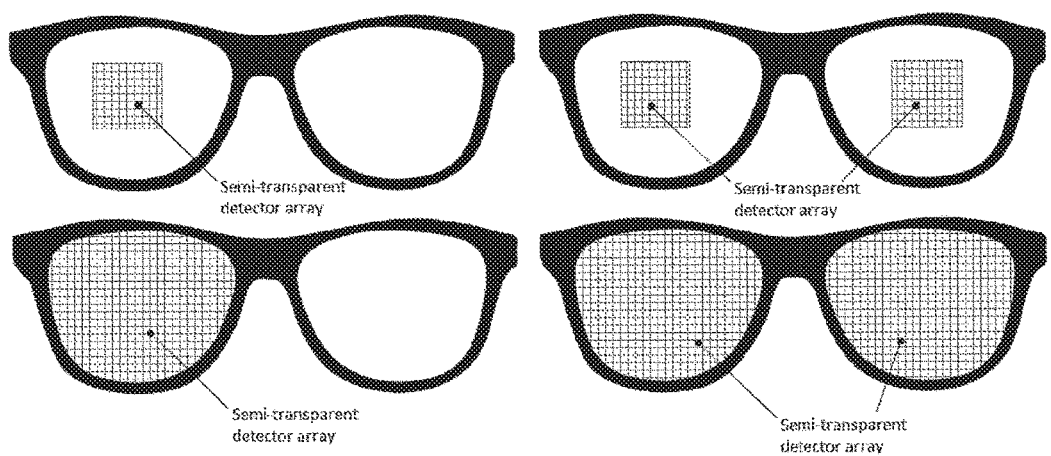
FIG. 21 schematically shows part of the gaze tracking apparatus of the present invention, where the optoelectronic device is a wearable device, particularly an eyeglasses, for four embodiments, differing in that the first area of the substrate (i.e. that including the detector array or pixels of the image sensor), occupies part or the entire glass or glasses of the eyeglasses, FIG. 22 schematically shows part of the gaze tracking apparatus of the invention, for different embodiments for which the apparatus comprises a computing device, such as a computer monitor (left) or a mobile phone screen (right), and the first area of the substrate covers the screen of the phone partially (top views) or entirely (bottom views).

FIG. 21 shows different possibilities for integrating the apparatus on spectacles. The semi-transparent image sensor that provides the gaze tracking can cover the entire glass (bottom views), or only part (top views) of the glass. For improved accuracy, the gaze tracking apparatus can be placed on both glasses of the spectacles as illustrate in the right views of FIG. 21.

An implementation for a virtual reality application is shown in FIG. 20, where the image sensor is arranged on the lens or visor of a virtual reality goggles or headset, between the eye and a display.

An implementation in an augmented reality system (or smart glasses) or on the visor of a helmet, not shown, can also be performed with the apparatus of the present invention.

Figure 22:
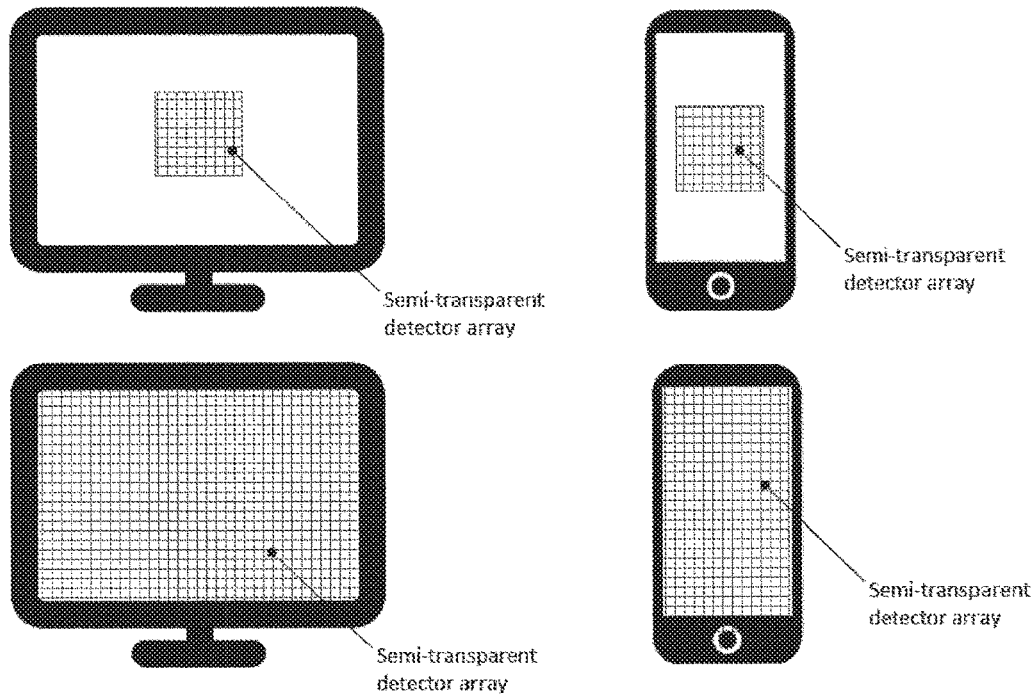

Implementations of the apparatus of the invention on the screen of different computing devices are shown in FIG. 22, for different embodiments.

Figure 23:
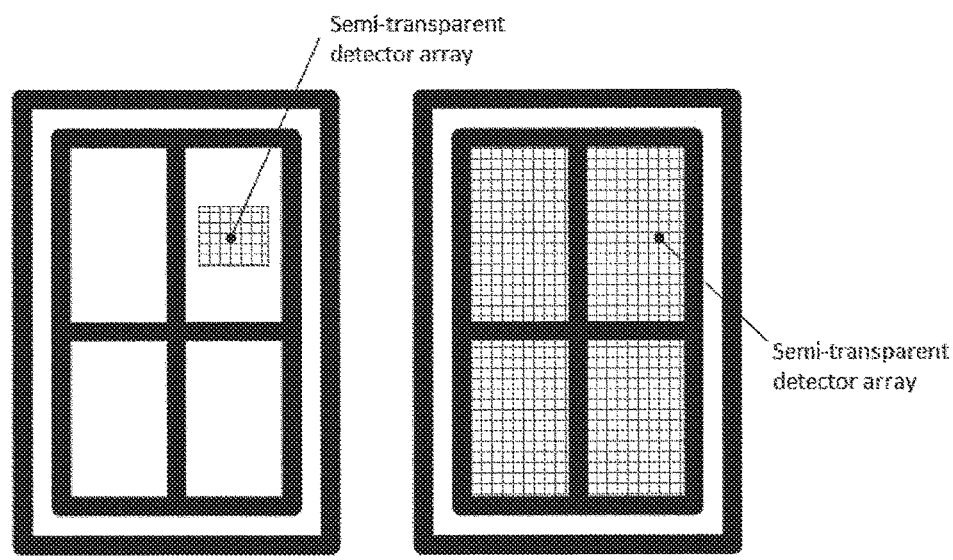
FIG. 23 schematically shows part of the gaze tracking apparatus of the invention, applied to a window, where the first area of the substrate covers the window partially (left view) or entirely (right view).
Figure 24:
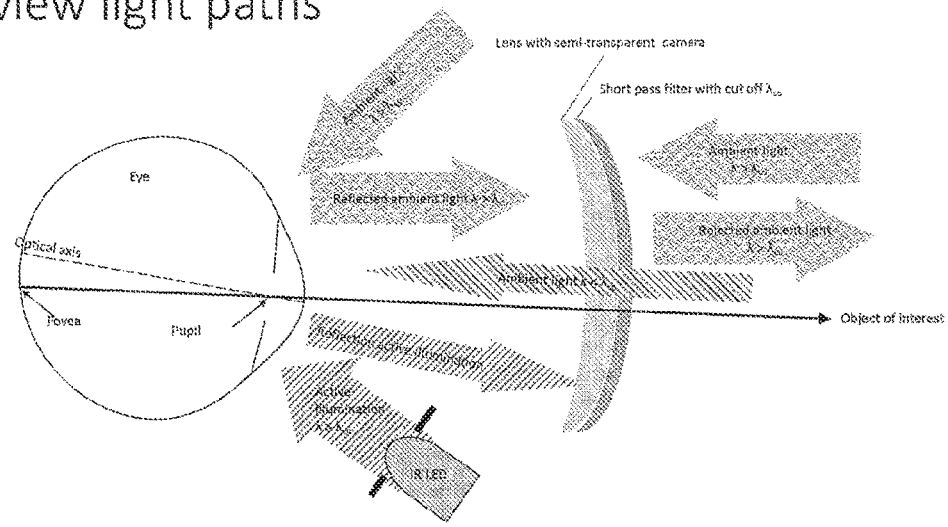
FIG. 24 schematically shows part of the gaze tracking apparatus of the present invention, for another embodiment for which a light filter is applied to an outer face of the substrate 8 in this case a lens), and the apparatus operates in a SWIR range. The drawing also shows the different light paths involved in the operation, where there have been separated visible (<700 nm) and NIR, SWIR and MIR light ($>\lambda_{co}$).

Finally, FIG. 23 represents an implementation of the apparatus of the present invention on a window, where the image sensor is attached or integral with the window partially (left view) or entirely (right view).

While the invention has been described with respect to some specific examples, including presently preferred modes of carrying out the invention, those skilled in the art will appreciate that there are numerous variations and permutations of the above described image sensor and optoelectronic device using said image sensor, including substitution of specific elements by others technically equivalent, without departing from the scope of the invention as set forth in the appended claims.

What is claimed is:

1. A gaze tracking apparatus, comprising an optoelectronic device, wherein the optoelectronic device comprises:
    a substrate having a first area that is at least partially transparent to visible light,
    a plurality of photodetectors arranged on said first area of the substrate to aim to an eye of a user when placed in front of an inner face of said substrate, and
    a control unit operatively connected to the plurality of photodetectors to at least receive output signals supplied from each of the photodetectors when light impinges thereon, wherein the control unit is also adapted to perform a gaze tracking of said eye based on the output signals from the photodetectors, and further wherein the control unit comprises:
    a first biasing circuit for providing a first biasing voltage;
    a second biasing circuit for providing a second biasing voltage, the second biasing voltage being substantially symmetrical to the first biasing voltage with respect to a voltage reference; and
    a non-local readout circuit for reading out a photo-signal generated by light impinging on a plurality of pixels;
    wherein the first biasing circuit and the second biasing circuit comprise, respectively, first selection means and second selection means to selectively bias one or more pixels of said plurality of pixels that are to be read out at a given time, the first selection means and the second selection means being arranged outside the first area of the substrate; and
    wherein each pixel of the plurality of pixels comprises:
    a photo-active element comprising a photosensitizing layer associated to a transport layer, the transport layer including at least one layer of a two-dimensional material;
    a non-photo-active reference element disposed proximate to the photo-active element, the non-photo-active reference element having a dark conductance that substantially matches a dark conductance of the photo-active element;
    a first contact circuitally connected to the first biasing circuit;
    a second contact circuitally connected to the second biasing circuit; and
    an output contact circuitally connected to the non-local readout circuit;
    wherein the photo-active element is circuitally connected between the first contact and the output contact, and the non-photoactive reference element is circuitally connected between the output contact and the second contact;
    wherein the optoelectronic device comprises an image sensor with the non-local readout circuit, wherein said image sensor comprises said substrate and the plurality of pixels arranged on the first area of the substrate, said plurality of pixels comprising said plurality of photodetectors, the plurality of photodetectors comprising the photo-active elements and having a built-in photoconductive gain; and
    wherein the control unit is adapted to selectively bias said plurality of pixels and read them out by means of the non-local readout circuit comprised by the control unit, said non-local readout circuit being arranged outside the first area of the substrate, and wherein the control unit is also adapted to control the image sensor to acquire image information from said eye for performing said gaze tracking of said eye.

2. The gaze tracking apparatus of claim 1, wherein said control unit comprises a processing unit and associated electric and electronic circuitry, including readout electronics, and that is operatively connected to or includes said non-local readout circuit, for receiving and processing said acquired image information to perform said gaze-tracking of said eye.

3. The gaze tracking apparatus of claim 2, wherein at least part of said control unit, including said readout electronics, is arranged on an area of the substrate that is outside the first area of the substrate and/or on an area of another substrate.

4. The gaze tracking apparatus of claim 3, wherein said area of the substrate or of said another substrate where said at least part of the control unit is arranged, is an area that is non-transparent to visible light.

5. The gaze tracking apparatus of claim 3, wherein the optoelectronic device is a wearable device, wherein said substrate is, or comprises, or is attached to, or embedded in, an eyeglass, lens, or visor of said wearable device that stands in front of the user's eye when the user wears the wearable device, and wherein said at least part of the control unit is arranged out of said eyeglass, lens, or visor.

6. The gaze tracking apparatus of claim 5, wherein said wearable device is one of an eyeglasses and a goggles, comprising at least said eyeglass or lens.

7. The gaze tracking apparatus of claim 6, wherein said at least part of the control unit arranged out of the eyeglass or lens is arranged in a frame of the eyeglasses.

8. The gaze tracking apparatus of claim 5, wherein said wearable device is a helmet comprising said visor.

9. The gaze tracking apparatus of claim 3, wherein said substrate is, or comprises, or is attached to, or embedded in, a panel that is at least partially transparent to visible light.

10. The gaze tracking apparatus of claim 9, wherein said panel is at least one of a window and a screen.

11. The gaze tracking apparatus of claim 10, further comprising a computing device that includes said screen.

12. The gaze tracking apparatus of claim 1, wherein the optoelectronic device is made and arranged to position, in use, the first area of the substrate in front of said eye of the user when placed in front of said inner face of the substrate, so that the user can see through the first area of the substrate.

13. The gaze tracking apparatus of claim 1, made and arranged to operate under passive illumination, wherein the image sensor is made and arranged to acquire said image information from a portion of ambient light that is reflected off of the user's eye.

14. The gaze tracking apparatus of claim 1, further comprising an active illumination unit comprising at least one light source that is operatively connected to said control unit, and made and arranged to emit light, in use, towards said user's eye under the control of said control unit, and wherein the image sensor is made and arranged to acquire said image information from light that is emitted from the at least one light source and is reflected off of the user's eye.

15. The gaze tracking apparatus of claim 14, wherein said at least one light source and said image sensor operate in an eye-safe short-wave infrared range.

16. The gaze tracking apparatus of claim 15, comprising a light filter for blocking ambient light, wherein said light filter is arranged on or attached to an outer face of the substrate, opposite to said inner face, or embedded in a surface between the plurality of photodetectors and said outer face of the substrate.

17. The gaze tracking apparatus of claim 1, further comprising lenses covering the photo-active elements of the image sensor, wherein said lenses are at least partially transparent to visible light.

18. The gaze tracking apparatus of claim 17, further comprising electrically conductive traces for electrically connecting at least the control unit and the image sensor, wherein said electrically conductive traces are arranged at least in part on the first area of the substrate, or of another substrate at least partially transparent to visible light and that is attached to or embedding said substrate.

19. The gaze tracking apparatus of claim 18, wherein said electrically conductive traces are at least partially transparent to visible light.

20. The gaze tracking apparatus of claim 18, wherein said electrically conductive traces are opaque to visible light, sufficiently thin and distributed through the first area of the substrate with such a separation between them to allow a user to see through the first area of the substrate.

* * * * *